(12) United States Patent
Rini et al.

(10) Patent No.: US 7,921,664 B2
(45) Date of Patent: Apr. 12, 2011

(54) METHOD AND APPARATUS FOR HIGH HEAT FLUX HEAT TRANSFER

(75) Inventors: Daniel P. Rini, Orlando, FL (US); H. Randolph Anderson, Clermont, FL (US); Jayanta Sankar Kapat, Oviedo, FL (US); Louis Chow, Orlando, FL (US); Bradley G. Carman, Sanford, FL (US); Benjamin A. Saarloos, Orlando, FL (US)

(73) Assignee: Rini Technologies, Inc., Oviedo, FL (US)

( * ) Notice: Subject to any disclaimer, the term of this patent is extended or adjusted under 35 U.S.C. 154(b) by 628 days.

(21) Appl. No.: 12/046,015

(22) Filed: Mar. 11, 2008

(65) Prior Publication Data

US 2008/0210406 A1 Sep. 4, 2008

Related U.S. Application Data

(63) Continuation of application No. 11/305,525, filed on Dec. 16, 2005, now Pat. No. 7,654,100, which is a continuation-in-part of application No. 10/348,850, filed on Jan. 22, 2003, now Pat. No. 6,993,926, which is a continuation-in-part of application No. 10/115,510, filed on Apr. 2, 2002, now Pat. No. 6,571,569, said application No. 10/348,850 is a continuation-in-part of application No. 10/342,669, filed on Jan. 14, 2003, now abandoned.

(60) Provisional application No. 60/350,857, filed on Jan. 22, 2002, provisional application No. 60/350,871, filed on Jan. 22, 2002, provisional application No. 60/350,687, filed on Jan. 22, 2002, provisional application No. 60/290,368, filed on May 12, 2001, provisional application No. 60/286,288, filed on Apr. 26, 2001, provisional application No. 60/286,771, filed on Apr. 26, 2001, provisional application No. 60/286,289, filed on Apr. 26, 2001, provisional application No. 60/353,291, filed on Feb. 1, 2002, provisional application No. 60/398,244, filed on Jul. 24, 2002, provisional application No. 60/654,023, filed on Feb. 17, 2005.

(51) Int. Cl.
*F25D 23/12* (2006.01)

(52) U.S. Cl. ........................................ 62/259.2; 62/304

(58) Field of Classification Search ................ 62/259.2, 62/304, 310, 376; 165/104.19; 361/688, 361/700
See application file for complete search history.

(56) References Cited

U.S. PATENT DOCUMENTS 4,068,495 A 1/1978 Alger et al.

(Continued)

FOREIGN PATENT DOCUMENTS

GB 1 356 114 A 6/1974

(Continued)

*Primary Examiner* — Melvin Jones
(74) *Attorney, Agent, or Firm* — Saliwanchik Lloyd & Eisenschenk

(57) ABSTRACT

The subject invention pertains to a method and apparatus for high heat flux heat transfer. The subject invention can be utilized to transfer heat from a heat source to a coolant such that the transferred heat can be effectively transported to another location. Examples of heat sources from which heat can be transferred from include, for example, fluids and surfaces. The coolant to which the heat is transferred can be sprayed onto a surface which is in thermal contact with the heat source, such that the coolant sprayed onto the surface in thermal contact with the heat absorbs heat from the surface and carries the absorbed heat away as the coolant leaves the surface. The surface can be, for example, the surface of an interface plate in thermal contact with the heat source or a surface integral with the heat source. The coolant sprayed onto the surface can initially be a liquid and remain a liquid after absorbing the heat, or can in part or in whole be converted to a gas or vapor after absorbing the heat. The coolant can be sprayed onto the surface, for example, as a stream of liquid after being atomized, or in other ways which allow the coolant to contact the surface and absorb heat. Once the heat is absorbed by the coolant, the coolant can be transported to another location so as to transport the absorbed heat as well.

64 Claims, 26 Drawing Sheets

U.S. PATENT DOCUMENTS

| | | |
|---|---|---|
| 4,141,224 A | 2/1979 | Alger et al. |
| 4,306,278 A | 12/1981 | Fulton et al. |
| 4,413,345 A | 11/1983 | Altman |
| 4,444,495 A | 4/1984 | Bramwell et al. |
| 4,776,181 A | 10/1988 | Maule |
| 4,791,634 A | 12/1988 | Miyake |
| 5,105,430 A | 4/1992 | Mundinger et al. |
| 5,220,804 A | 6/1993 | Tilton et al. |
| 5,263,536 A | 11/1993 | Hulburd et al. |
| 5,353,865 A | 10/1994 | Adiutori et al. |
| 5,406,807 A | 4/1995 | Ashiwake et al. |
| 5,453,641 A | 9/1995 | Mundinger et al. |
| 5,471,491 A | 11/1995 | Phillips et al. |
| 5,526,372 A | 6/1996 | Albrecht et al. |
| 5,606,201 A | 2/1997 | Lutz |
| 5,687,577 A | 11/1997 | Ballard et al. |
| 5,718,117 A | 2/1998 | McDunn et al. |
| 5,768,103 A | 6/1998 | Kobrinetz et al. |
| 5,818,692 A | 10/1998 | Denney, Jr. et al. |
| 5,854,092 A | 12/1998 | Root et al. |
| 5,880,931 A | 3/1999 | Tilton et al. |
| 5,907,473 A | 5/1999 | Przilas et al. |
| 5,943,211 A | 8/1999 | Havey et al. |
| 5,992,159 A | 11/1999 | Edwards et al. |
| 5,999,404 A | 12/1999 | Hileman |
| 6,064,572 A | 5/2000 | Remsburg |
| 6,085,833 A | 7/2000 | Kimura et al. |
| 6,108,201 A | 8/2000 | Tilton et al. |
| 6,498,725 B2 | 12/2002 | Cole et al. |
| 6,571,569 B1 * | 6/2003 | Rini et al. ............ 62/259.2 |
| 6,993,926 B2 | 2/2006 | Rini et al. |
| 2001/0002541 A1 | 6/2001 | Patel et al. |
| 2003/0155434 A1 | 8/2003 | Rini et al. |
| 2006/0117782 A1 | 6/2006 | Rini et al. |

FOREIGN PATENT DOCUMENTS

| | | |
|---|---|---|
| JP | 62 119947 A | 11/1987 |

* cited by examiner

METHOD AND APPARATUS FOR HIGH HEAT FLUX HEAT TRANSFER

CROSS-REFERENCE TO RELATED APPLICATIONS

This present application is a continuation of U.S. Ser. No. 11/305,525, filed Dec. 16, 2005, now U.S. Pat. No. 7,654,100 which is a continuation-in-part of U.S. Ser. No. 10/348,850, filed Jan. 22, 2003, now U.S. Pat. No. 6,993,926, which is a continuation-in-part of U.S. Ser. No. 10/115,510, filed Apr. 2, 2002, now U.S. Pat. No. 6,571,569, which claims the benefit of U.S. Ser. No. 60/350,857, filed Jan. 22, 2002; U.S. Ser. No. 60/350,871, filed Jan. 22, 2002; U.S. Ser. No. 60/350,687, filed Jan. 22, 2002; U.S. Ser. No. 60/290,368, filed May 12, 2001; U.S. Ser. No. 60/286,288, filed Apr. 26, 2001; U.S. Ser. No. 60/286,771, filed Apr. 26, 2001; and U.S. Ser. No. 60/286,289, filed Apr. 26, 2001, each of which is incorporated herein by reference in its entirety. U.S. Ser. No. 10/348,850, filed Jan. 22, 2003, now U.S. Pat. No. 6,993,926, is also a continuation-in-part of U.S. Ser. No. 10/342,669, filed Jan. 14, 2003, now abandoned which claims the benefit of U.S. Ser. No. 60/353,291, filed Feb. 1, 2002, and U.S. Ser. No. 60/398,244, filed Jul. 24, 2002, each of which is incorporated herein by reference in its entirety. U.S. Ser. No. 11/305,525 also claims benefit of U.S. provisional patent application U.S. Ser. No. 60/654,023, filed Feb. 17, 2005, which is incorporated herein by reference in its entirety.

BACKGROUND OF THE INVENTION

In recent years, attention has been focused on methods of high heat flux removal at low surface temperatures. This is due in large part to the advancing requirements of the electronics industry that prevent high temperature heat transfer due to the operating conditions of electronics. Though the heat transfer process is very complex and still not completely understood, many evaporative spray cooling experiments have been performed which indicated the high heat removal capability of this cooling technique. The spray technique generally works in the following way; a spray nozzle is used to atomize a pressurized liquid, and the resulting droplets are impinged onto a heated surface. A thin film of liquid is formed on the heat transfer surface in which nucleate boiling takes place. The droplet impingement simultaneously causes intense convection and free surface evaporation. When a liquid with a high latent heat of vaporization (such as water) is used, over 1 kW/cm$^2$ of heat removal capability has been demonstrated.

The temperature of the cooled surface is determined by the boiling point of the liquid. Since the resulting heat transfer coefficient is very large (50,000 to 500,000 W/m$^2$C) the surface temperature will be only a few degrees centigrade above the boiling point of liquid.

This type of cooling technique is most appropriately implemented when used to cool high heat flux devices such as power electronics, microwave and radio frequency generators, and diode laser arrays.

Prior art describes processes and devices related to cooling of small, individual electronic chips. This can be seen in, for example, U.S. Pat. Nos. 5,854,092; 5,718,117; and 5,220,804. This prior art uses a liquid spray to cool individual electronic components, or an array of these individual components located at discrete distances from each other. Since the electronic components (the heat sources) are individual devices with spaces between, the liquid spray cones do not overlap or interact with each other. The typical size of an electronic chip is 2 cm$^2$ in area and is spaced at a distance of 0.5 to 1 cm. This allows the prior art to cool these chips with an impinging spray without interfering with the spray process of the surrounding chips.

As stated above, diode laser arrays and microwave generators are devices that can be cooled with this type of impinging spray technology. Current market forces are driving these devices to increased power and size requirements. As a result, high heat flux devices are now being designed with surface areas much larger than 2 cm$^2$. New high heat flux devices will be 100 cm$^2$ to 1000 cm$^2$. The entire large surface area will need to be cooled at the same high heat flux rate as the small devices were in the prior art. However, the prior art does not detail a method to cool such a large device. Rather, the prior art only details a method to cool several small individual devices.

It may be thought that a large surface could be cooled with an array of nozzles spraying down on the large surface in the same way a single nozzle sprays down on a small surface, as shown in the prior art. However, it has been shown in a study with air jet impingement that scaling in this way is not possible. Instead, the effectiveness of the jets or sprays in the center of the array interact with each other in a way that considerably reduces the ability to transfer heat. This is a result of the fluid flow accumulating as the fluid moves outward from the stagnation point. A good portion of the impinging droplets are vaporized with this system, however, this is not so for all the liquid. The remaining liquid will flow off the heated surface and be returned to the pump. When the surface is large, the fluid from the nozzles at the center of the surface will need to travel across the entire surface before exiting at the edges. This can be called the "spray liquid run-off problem."

BRIEF SUMMARY OF THE INVENTION

The subject invention pertains to a method and apparatus for high heat flux heat transfer. The subject invention can be utilized to transfer heat from a heat source to a coolant such that the transferred heat can be effectively transported to another location. Examples of heat sources from which heat can be transferred from include, for example, fluids and surfaces. The coolant to which the heat is transferred can be sprayed onto a surface which is in thermal contact with the heat source, such that the coolant sprayed onto the surface in thermal contact with the heat absorbs heat from the surface and carries the absorbed heat away as the coolant leaves the surface. The surface can be, for example, the surface of an interface plate in thermal contact with the heat source or a surface integral with the heat source. The coolant sprayed onto the surface can initially be a liquid and remain a liquid after absorbing the heat, or can in part or in whole be converted to a gas or vapor after absorbing the heat. The coolant can be sprayed onto the surface, for example, as a stream of liquid after being atomized, or in other ways which allow the coolant to contact the surface and absorb heat. Once the heat is absorbed by the coolant, the coolant can be transported to another location so as to transport the absorbed heat as well.

The subject invention pertains to a method and apparatus for cooling surfaces and/or devices. In a specific embodiment, the subject invention can incorporate a spray nozzle and a cooling/electronic interface surface. The spray nozzle may use pressurized liquid (commonly known as pressure atomizer nozzles), pressurized liquid and pressurized vapor (commonly known as vapor assist nozzles), and/or pressurized vapor (commonly known as vapor blast or vapor atomizer nozzles) to develop the atomized liquid spray used in the cooling process.

The subject invention also relates to a heat transfer apparatus having an enhanced surface which can increase the rate of heat transfer from the surface to an impinging fluid. The subject enhanced surface can be incorporated with any of the heat transferred surfaces disclosed in the subject patent application or incorporated with other heat transfer surfaces. The subject invention also pertains to heat transfer apparatus, such as heat transfer plates, which incorporate the subject enhanced surfaces. The subject enhanced surfaces can also be utilized for heat desorption from a surface.

FIGS. 12A-12E show specific examples of surface enhancements that can be utilized in accordance with the subject matter. The subject surface enhancements shown in FIGS. 12A-12E, and/or other similar surface enhancements, can be utilized with any embodiment of the subject invention incorporating a heat transfer surface.

In a specific embodiment, the cooling/electronic interface surface can be compartmentalized such that spray entering one compartment is impeded from crossing over to adjacent compartments. In a further specific embodiment, a plurality of nozzles can each spray into one of a plurality of compartments such that spray from each individual nozzle is applied to a specific target area. For example, each nozzle may spray one compartment. The excess liquid which enters each compartment can then be forced out of the compartment in a counter-parallel flow from the spray direction rather than a perpendicular flow as in prior art, so as to correct the liquid run-off problem. The shape and depths of the compartments can vary according to the type of nozzle used to atomize the liquid coolant. Preferably, the subject compartments incorporate side walls which can redirect the exiting flow in a pattern that is not perpendicular to the incoming flow.

The atomized spray can be directed onto the rear surface of the compartmentalized interface plate. The spray is preferably positioned to create the most even application of atomized liquid onto the entire rear surface. The liquid can be sprayed at a temperature near its boiling point. Thus, when the liquid hits the heated surface in the rear of the compartment, the liquid can begin to boil. The heat from the electronics, or other heat source, is transferred through the interface into the boiling liquid spray at a very high rate. The created coolant vapor and excess liquid exit the compartment in a direction that is not perpendicular to the incoming flow. Under the operating conditions of an open loop system, the boiling point of the liquid coolant must be at ambient pressure since the evaporating environment is exposed to the ambient. Under these conditions, the heat removed by the developed vapor is released to the atmosphere. However, not all vaporized coolants can be responsibly released to the atmosphere, due, for example, to environmental concerns. In addition, coolants with boiling points other than ambient may be preferred. Accordingly, specific embodiments of the subject invention can be operated in a closed loop.

In a closed loop system, the interface plate can be located within a sealed housing so that the spray and the resultant vapor is trapped within the sealed housing. Under this condition, the pressure within the housing can influence the boiling point of the coolant and the operating temperature. As the coolant vaporizes, it carries the heat from, for example, electronics, away from the interface plate. Since the system is now closed, the vapor can be condensed and the heat released out of the housing through a condenser. The condenser can incorporate, for example, a standard heat exchanger or can operate via a sub-cooled mist of the coolant sprayed within the housing. The mist can be sub-cooled below the saturation temperature of the coolant within the housing via an external heat exchanger. As the sub-cooled liquid spray contacts the saturated vapor, heat is transferred to the spray and the vapor condenses on the liquid droplets and flows to a liquid reservoir.

The coolant can be drawn from the liquid reservoir, for example, by a liquid pump or via venturi action of a vapor atomizer nozzle. The liquid then flows through the nozzle and is once again sprayed onto the interface plate. The circulation of the coolant within the closed process depends on the type of atomizer used. If pressure atomizer nozzles are used, then a liquid pump can suffice. If vapor assist nozzles or vapor atomizer nozzles are used, then both a vapor compressor and a liquid pump can be used in the circulation of the coolant.

Typically, the heat gained by the liquid in the closed system is transferred to a refrigerant of a vapor compression cycle via a heat exchanger. The vapor compression cycle increases the temperature of the now warmer refrigerant and allows it to release the heat to the environment. This is commonly known as the chiller loop.

An additional feature can be added to the closed system that combines it with a vapor compression cycle without the heat exchanger interface between the two loops. This combination involves using a refrigerant as the coolant in both loops. Under this scenario, liquid refrigerant can be atomized onto the interface plate. Vapor and excess liquid refrigerant can be expelled from the compartment and flow into the housing. The saturated vapor can be removed from the housing with a vapor compressor and can be compressed to a temperature above ambient temperature of the final heat sink, for example atmospheric air. The now superheated vapor can flow through a heat exchanger releasing the heat to the final heat sink. As the heat is released, the superheated vapor condenses to liquid refrigerant. As is common to vapor compression cycles, the higher pressure saturated liquid can flow through an expansion valve. The liquid is allowed to expand to the pressure of the housing, cools to its saturation temperature within the housing, and flows to the liquid reservoir ready to begin the process once again.

DETAILED DESCRIPTION

The subject invention pertains to a method and apparatus for high heat flux heat transfer. The subject invention can be utilized to transfer heat from a heat source to a coolant such that the transferred heat can be effectively transported to another location. Examples of heat sources from which heat can be transferred from include, for example, fluids and surfaces. The coolant to which the heat is transferred can be sprayed onto a surface which is in thermal contact with the heat source, such that the coolant sprayed onto the surface in thermal contact with the heat source absorbs heat from the surface and carries the absorbed heat away as the coolant leaves the surface. The surface can be, for example, the surface of an interface plate in thermal contact with the heat source or a surface integral with the heat source. The coolant sprayed onto the surface can initially be a liquid and remain a liquid after absorbing the heat, or can in part or in whole be converted to a gas or vapor after absorbing the heat. The coolant can be sprayed onto the surface, for example, as a stream of liquid after being atomized, or in other ways which allow the coolant to contact the surface and absorb heat. Once the heat is absorbed by the coolant, the coolant can be transported to another location so as to transport the absorbed heat as well.

Figure 1:
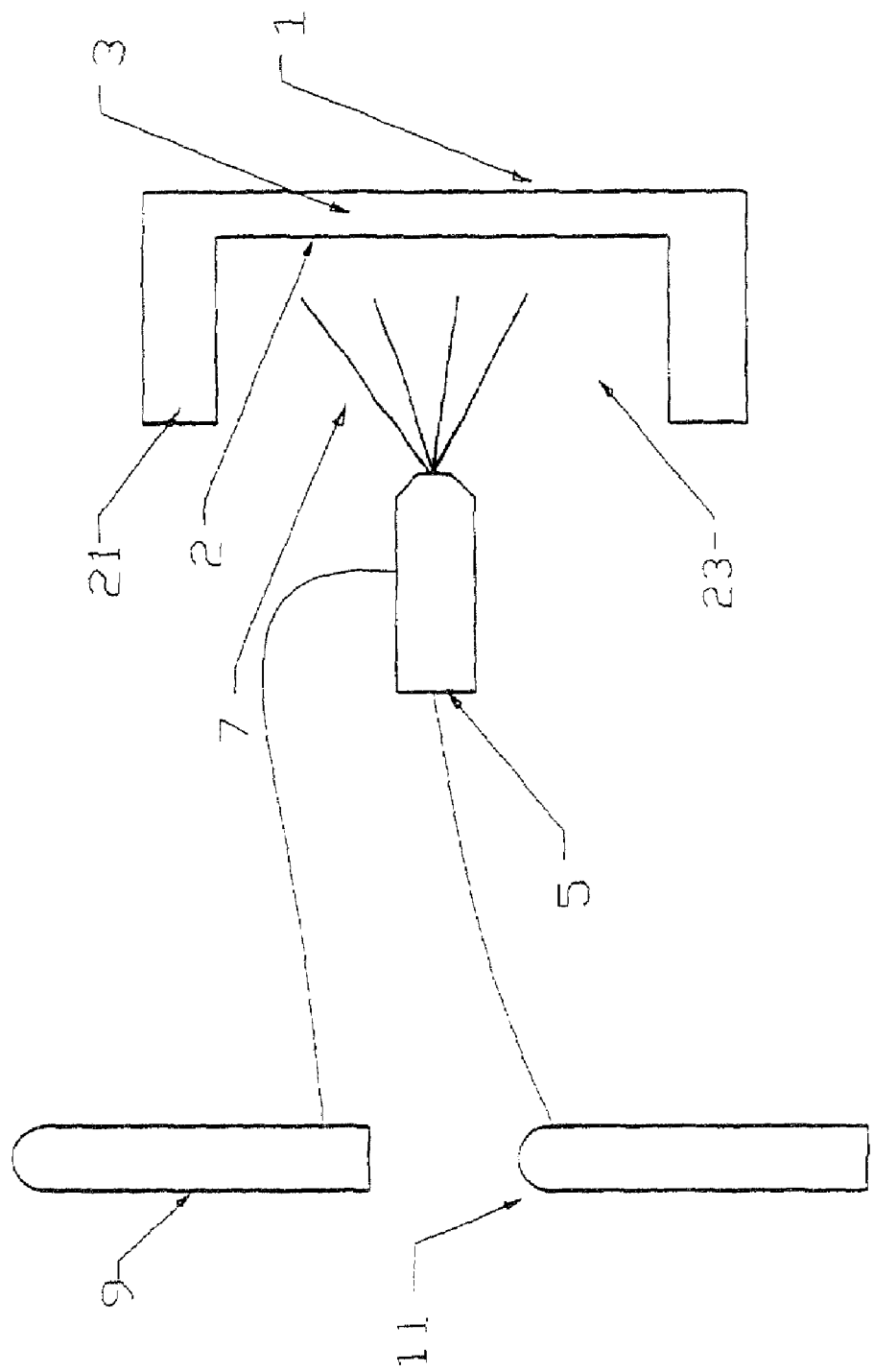
FIG. 1 shows a schematic illustration of a spray-nozzle spraying the atomized liquid coolant into a cell of a cooling plate in accordance with a specific embodiment of the subject invention.

In a specific embodiment, the subject invention relates to a cooling process which begins, as shown in FIG. 1, by attaching a heat source such as a high power electrical device to surface 1 of interface plate 3. Interface plate 3, as in the other embodiments of the subject invention, can be a separate plate in thermal contact with a heat source, or can be integral with a heat source, for example, a wall of a device producing heat which needs to be removed. Referring to the specific embodiment shown in FIG. 1, spray nozzle 5 atomizes liquid coolant into a spray compartment in a uniform spray pattern 7. If spray nozzle 5 is a pressure atomizer nozzle, then pressured liquid coolant can be supplied by a pressurized liquid source 9. This source can be, for example, a compressed storage tank or a supply pump drawing liquid coolant from a reservoir. If spray nozzle 5 is a vapor atomizing nozzle, then pressurized vapor can be supplied to spray nozzle 5 via compressed vapor source 11. The compressed vapor source 11 can be, for example, a compressed vapor storage tank or a vapor compressor. The flow of vapor through the vapor atomizing nozzle 5 can create a venturi draft on the liquid port such that the pressurized liquid source 9 need not be pressurized but, rather, can be, for example, a reservoir of liquid coolant. If spray nozzle 5 is a vapor assist nozzle then both the pressurized liquid source 9 and the pressurized vapor source 11 can be supplied to nozzle 5. The pressurized sources 9 and 11 can be supplied, for example, via pressurized storage tanks and/or a liquid pump and/or a vapor compressor.

Figure 2A:
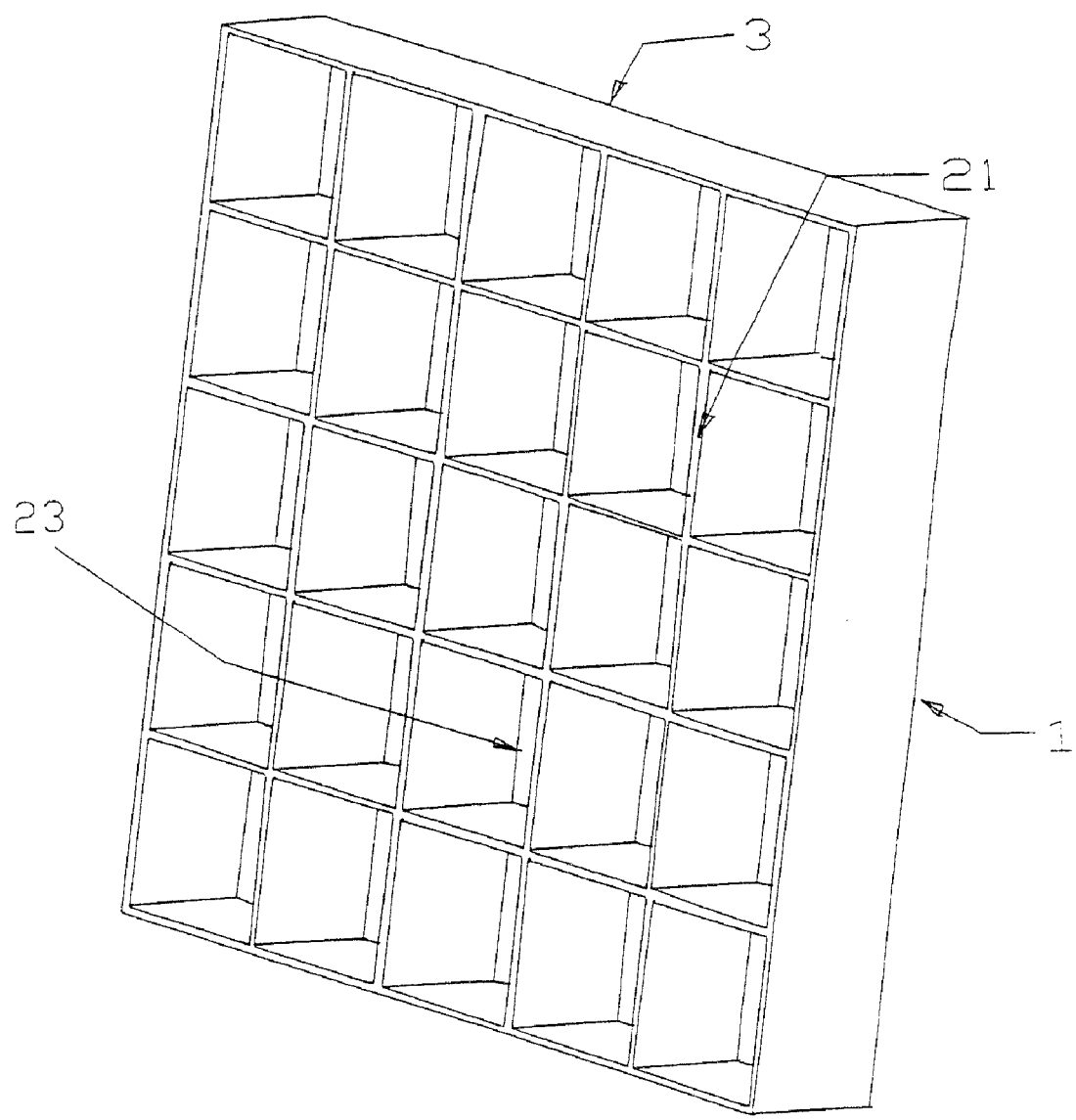
FIGS. 2A-2C show specific embodiments of a cooling plate having a plurality of cells, or compartments, in accordance with a specific embodiment of the subject invention.

A specific embodiment of an interface plate 3 in accordance with the subject invention is shown in FIG. 2A. The cooling plate 3 shown in FIG. 2A incorporates a set of partition walls 21 that protrude from the heated surface 2 of interface plate 3 and form subsections, or cells 23. In a preferred embodiment, each cell 23 has a surface area on surface 2 of about 0.5 to 2 cm$^2$. The walls can give the interface plate 3 an "ice cube tray" look, and protrude, for example, about 0.2 cm to 2 cm from surface 2. The shape of the subsections, or cells, can be, for example, circular, square, or other polygonal shapes. In a specific embodiment, the subsections can be honeycomb shaped. The surface area of the cells and the height to which the cell walls 21 protrude from surface 2 are preferably selected such that the coolant which is sprayed into the cell, after removing heat from surface 2, can escape from the cell without interfering with the heat transfer occurring in adjacent cells. Partition walls 21 shown in FIGS. 1 and 2A-2C can be used to reduce, or substantially eliminate, the flow of coolant incident on surface 2 out of cell 23 and into adjacent cells and reduce, or substantially eliminate, the flow of coolant incident on surface 2 of adjacent cells into cell 23. The coolant departing the subsection, or cell, in gas or vapor form can escape to the environment or, in the case of a closed system can be captured, converted back to liquid form, and resprayed onto surface 2. The coolant departing the subsection in liquid form can flow past the end of partition walls 21, be captured, optionally cooled, and resprayed onto surface 2. Other flow patterns, such as along the end of partition wall 21, can occur depending on the various parameters of the system.

Figure 2B:
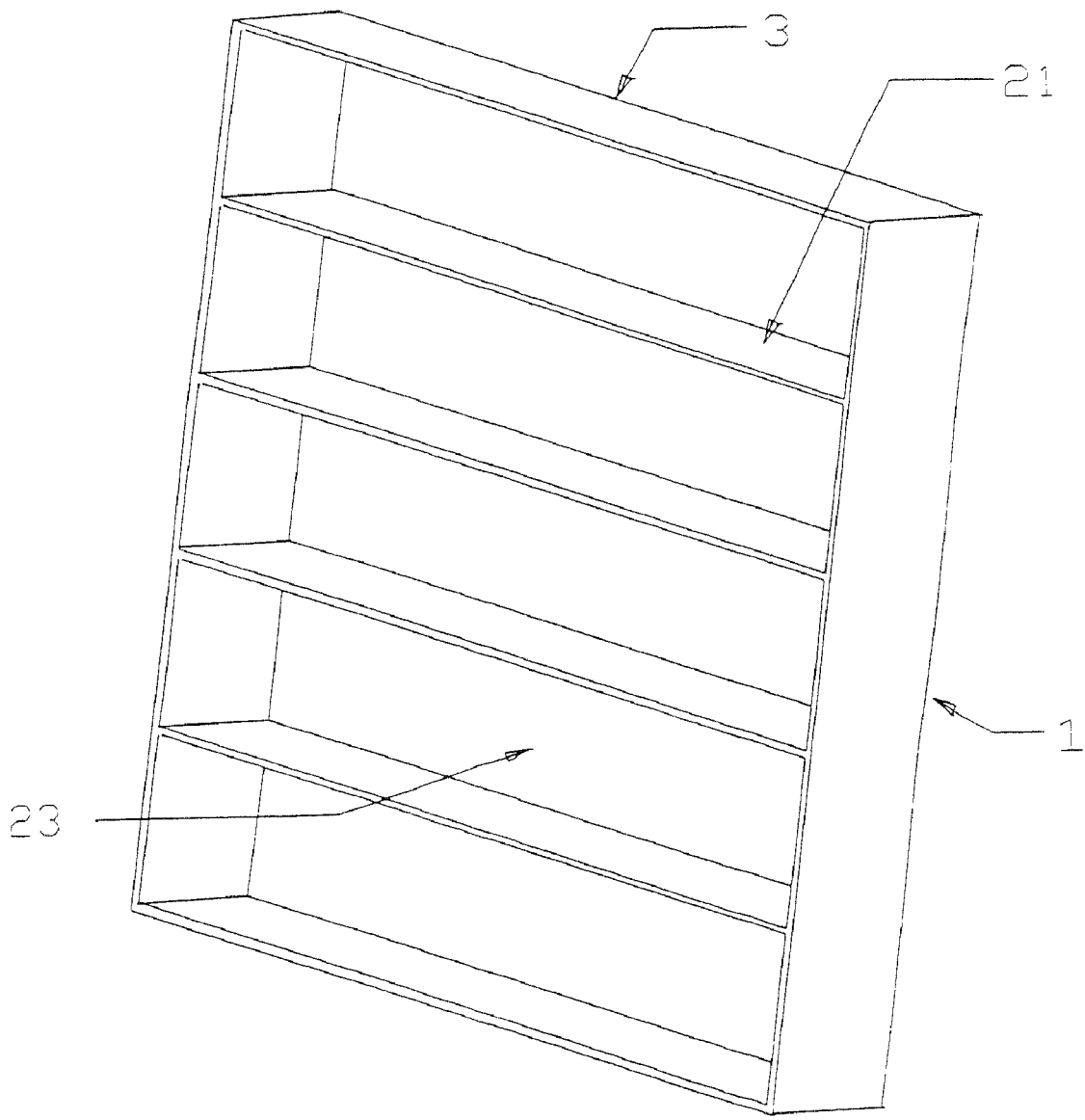

The number of compartments can be determined by the area of each compartment, the widths of the compartment walls 21, and the total area of desired cooling. Each compartment can have one or more nozzles which spray into the compartment. In a specific embodiment, the one or more nozzles spray onto the heated surface 2 at the bottom of the compartment. FIG. 2B shows a partition wall pattern which can accommodate more than one spray nozzle spraying into each cell 23. Each cell 23 shown in FIG. 2B can accommodate, for example, four spray nozzles. Although the partition walls 21 shown in FIGS. 2A-2C form a rectangular or square pattern and are of essentially constant thickness from end to end, other patterns can be utilized and the thickness of partition walls 21 can vary, depending on the application. For example, a hexagonal or other polygonal pattern, or even circular cells 23, may be preferred. In addition, the partition walls 21 may have an increased thickness near surface 2 to enhance the redirecting of the coolant flow out of the cell. Such increased thicknesses near surface 2 can provide a curved shaped wall such that coolant flowing on surface 2 and reaching the wall experiences a curved surface to transition from surface 2 onto the side of wall 21 rather than an abrupt corner between wall 21 and surface 2.

In a specific embodiment of the subject invention, partition walls 21 can be removed and a plurality of spray nozzles can spray surface 2 such that the spray of the adjacent nozzles does not overlap and the liquid coolant sprayed onto surface 2 travels along the surface of surface liquid 2 until running into the liquid coolant sprayed onto surface 2 by an adjacent nozzle. As the flows of coolant from adjacent spray nozzles collide, the collision can change the momentum of the flows such that at least a portion, and preferably essentially all, of the combined flow flows away from surface 2. Accordingly, after the collision of adjacent flows, a substantial portion of the combined flow's momentum can then be in a direction perpendicular to surface 2. In addition, the combined flow may have a certain amount of momentum parallel to surface 2, such that the combined flow flows as a river, above surface 2, near the portion of surface 2 where the collision of the two adjacent flows occurs. The direction of these river flows depends, among other factors, on the spray patterns of the adjacent spray nozzles, the speed of the spray, and the form of the coolant being sprayed onto surface 2. When partition walls are present, how far out partition walls 21 protrude from surface 2 can impact how the coolant which impinges on surface 2 flows away from cell 23. Partition walls 21 can protrude sufficiently far such that coolant impinging on surface 2, upon reaching the end of the partition wall, continues away from interface plate 3. Alternatively, if partition walls are made to protrude less, coolant reaching the ends of the partition walls can, at least in part, flow in a river flow along the ends of the partition walls. Again, the exact nature of how the coolant flows after reaching the ends of the partition walls is dependent, among other factors, on the spray patterns of the adjacent spray nozzles, the speed of the spray, and the size and form of the coolant being spraying onto surface 2.

Figure 2C:
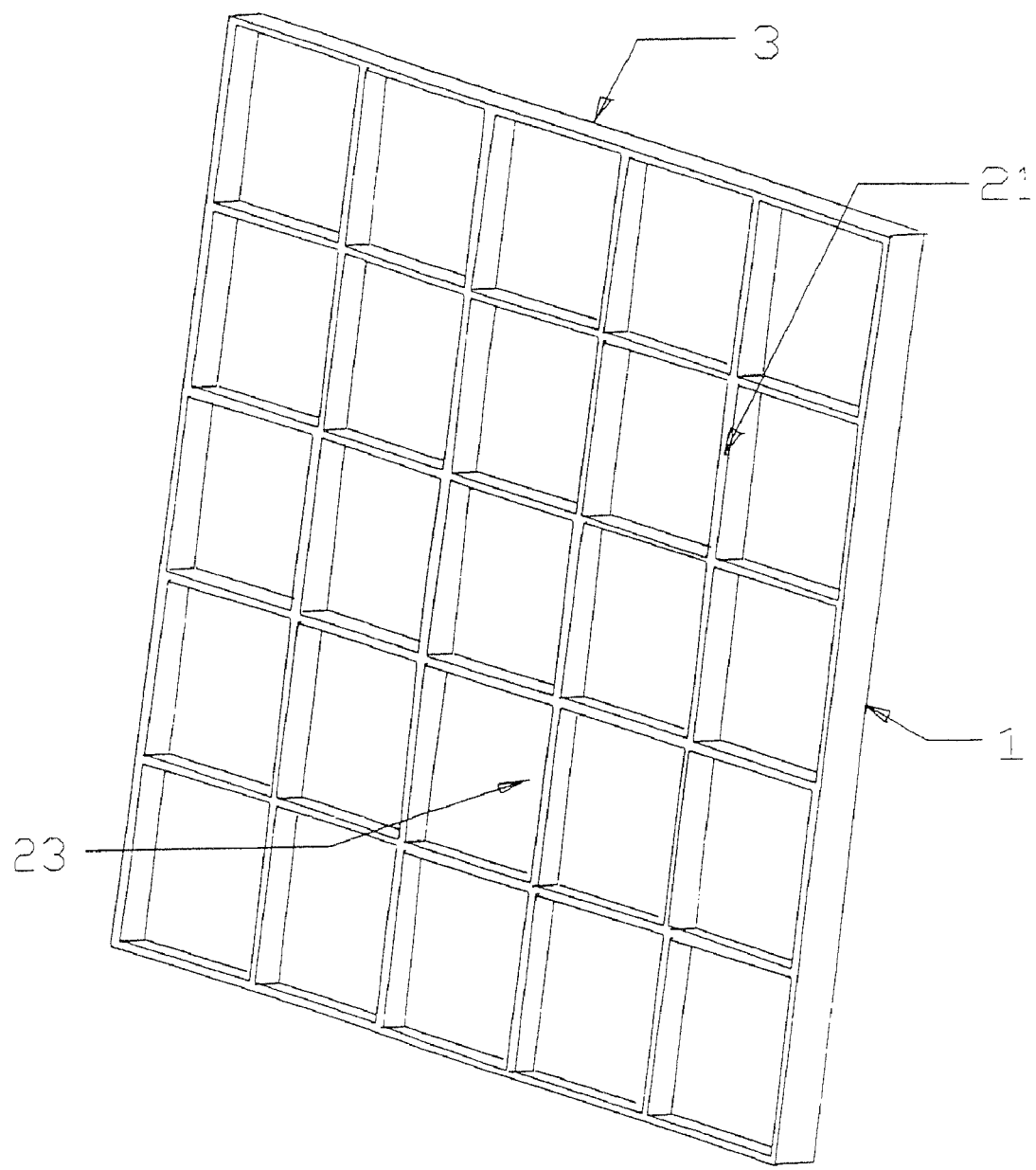
Figure 3:
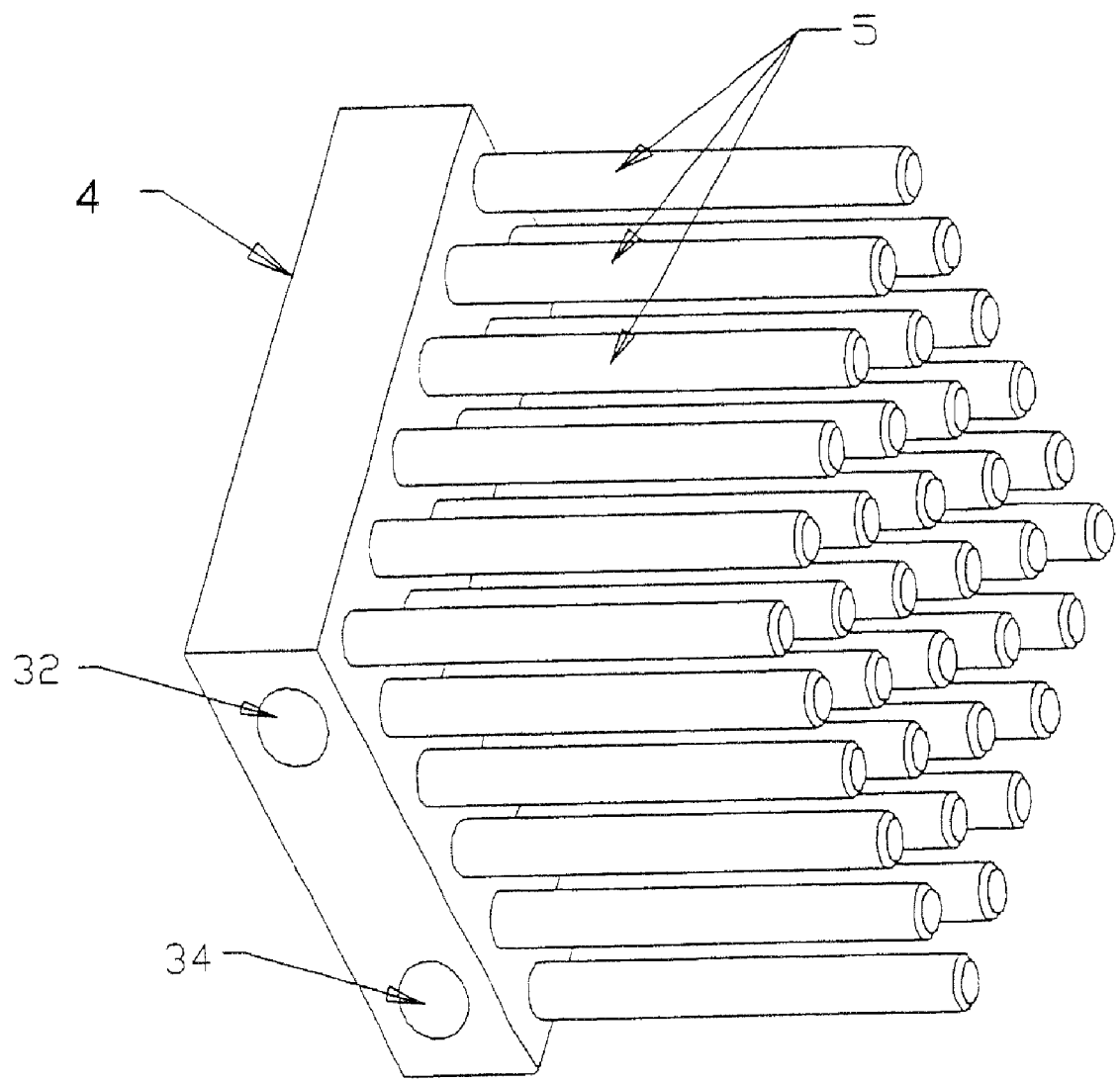
FIG. 3 shows a manifold of spray nozzles in accordance with a specific embodiment of the subject invention.
Figure 4:
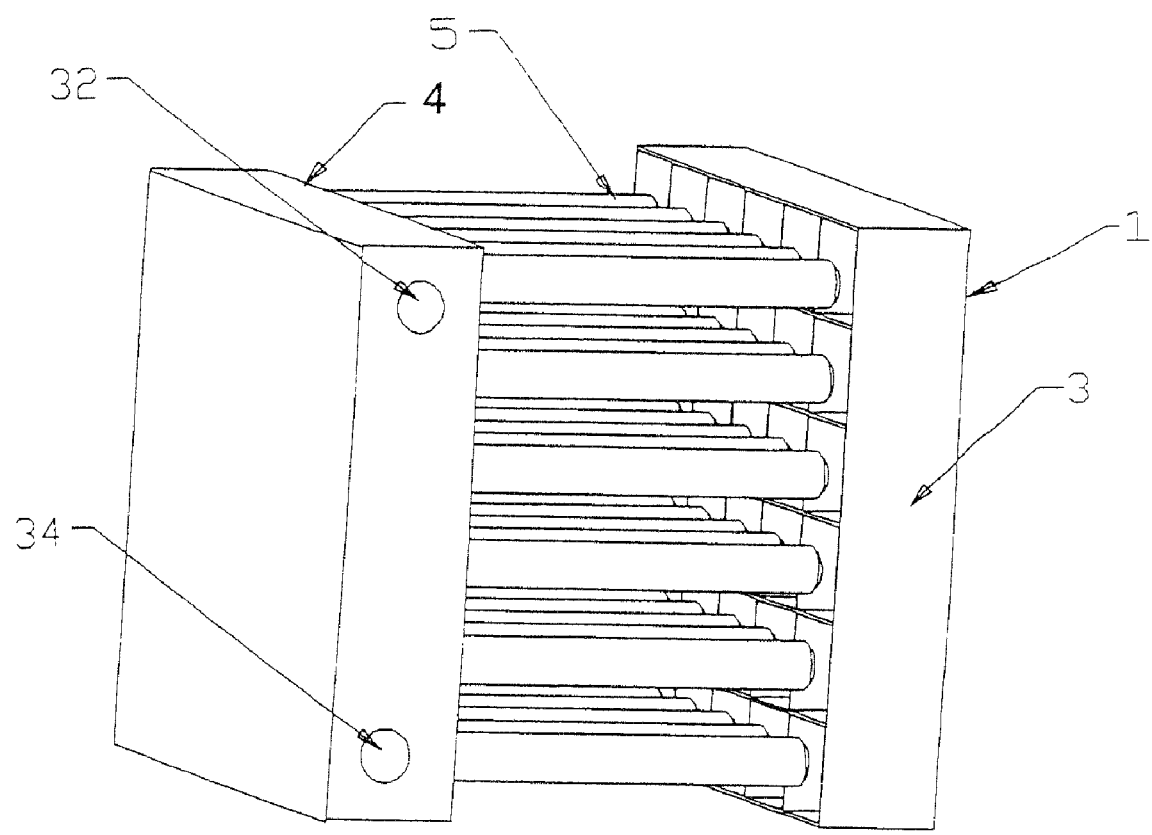
FIG. 4 shows the manifold of spray nozzles from FIG. 3 aligned with the plurality of cells from FIG. 2.

A manifold of spray nozzles in accordance with a specific embodiment of the subject invention is shown in FIG. 3. The spray nozzles 5 can be attached to manifold 4 with liquid inlet port 32 and vapor inlet port 34. A specific assembly of spray nozzle manifold 4 and compartmentalized interface plate 3 is shown in FIG. 4. In the embodiment shown in FIG. 4, each spray nozzle of the manifold of spray nozzles sprays coolant into a corresponding cell of the plurality of cells 23. In an alternative embodiment, more than one spray nozzle can spray coolant into a single cell. FIGS. 2B and 2C show embodiments of interface plates which can accommodate more than one spray nozzle per cell or compartment.

In alternative embodiments, surface 2 can be a surface of a heat source such as an electronics circuit chip, power electronic device, microwave or radio frequency generator, or diode laser array. In the situation where surface 2 is a surface of a heat source, partition walls 21 can be integral with the surface 2 of the heat source, or partition walls 21 can be part of a separate interface plate 3 without a surface 1 or surface 2 such that the partition walls themselves are the interface plate 3. In the latter case, interface plate 3, comprising partition walls 21 can be pressed against surface 2 of the heat source. If desired, a means for creating a seal between the partition walls 21 and surface 2. Such a sealing means can reduce, or substantially eliminate, flow of coolant between the ends of partition walls 21 and surface 2. In a specific embodiment, such means for sealing can be attached to the ends of partition walls 21 which will contact surface 2 of the heat source, such that as the ends of partition walls 21 are pressed against surface 2 a seal between the ends of partition walls 21 and surface 2 is created so as to reduce, or substantially eliminate, flow of coolant between the ends of partition walls 21 and surface 2. In a specific embodiment, interface plate 3 can be fixedly positioned with respect to a manifold of spray nozzles such that the manifold-interface plate combination can be brought into contact with a surface 2 of a heat source and operated to remove heat from surface 2 of the heat source.

Spray nozzles in accordance with the subject invention can spray, for example, jet sprays of coolant and or atomized sprays of coolant. Jet spray nozzles can spray liquid coolant in, for example, a solid cone or sheet such that the coolant hits the surface and breaks up. The coolant can then flow across surface 2. Atomizing spray nozzles can atomize the coolant into droplets of appropriate size and can provide the droplets with an appropriate velocity. Although a variety of droplet sizes and velocities can be utilized in accordance with the subject invention, in a specific embodiment an atomizing spray nozzle can be used which produces droplets having mean diameters in a range from about 10 microns to about 200 microns and provides the droplets a velocity in a range from about 5 meters per second to about 50 meters per second. Preferably, the size and velocity of the particles are such that the effects of gravity are negligible. Utilizing small droplets at high velocity can allow the method and apparatus of the subject invention to be used with heated surfaces 2 oriented in a variety of directions (e.g. vertical or horizontal) and can make it easier to provide coverage of the surface 2 with the spray coolant.

With high velocity spraying, a layer of coolant can form on surface 2 such that boiling occurs within the layer. As boiling occurs, bubbles will tend to grow, causing the portion of surface 2 under the bubble to not be wetted. However, the constant bombardment of liquid spray droplets onto surface 2 can help displace the bubbles and prevent the bubbles from growing larger. In this way, a larger portion of surface 2 can be kept wetted so as to increase heat transfer. Spray patterns from atomizing spray nozzles in accordance with the subject invention can be, for example, round, square, rectangular (which can be referred to as a fan spray pattern), or other shape appropriate to the shape of surface 2 and/or the partition walls 21. Preferably, for each shape spray pattern, an even spray pattern is achieved by the atomizing spray nozzle.

The subject method and apparatus can be utilized as an open system where the coolant which is converted to gas or vapor upon spraying onto surface 2 can escape, for example, into the environment. In such an open system, the coolant which remains in liquid form can be collected and reused. If desired, the collected liquid coolant can be cooled before reuse, or re-spraying back onto surface 2. The subject method and apparatus can also be utilized as a closed system where at least a portion, and preferably essentially all, of the coolant which is converted to gas or vapor upon spraying onto surface 2, as well as the coolant which remains in liquid form, can be collected and reused. In a specific embodiment, the subject method can utilize a sealed housing, which can maintain a pressure different from the environment, to contain the coolant and collect and process the coolant.

Figure 5:
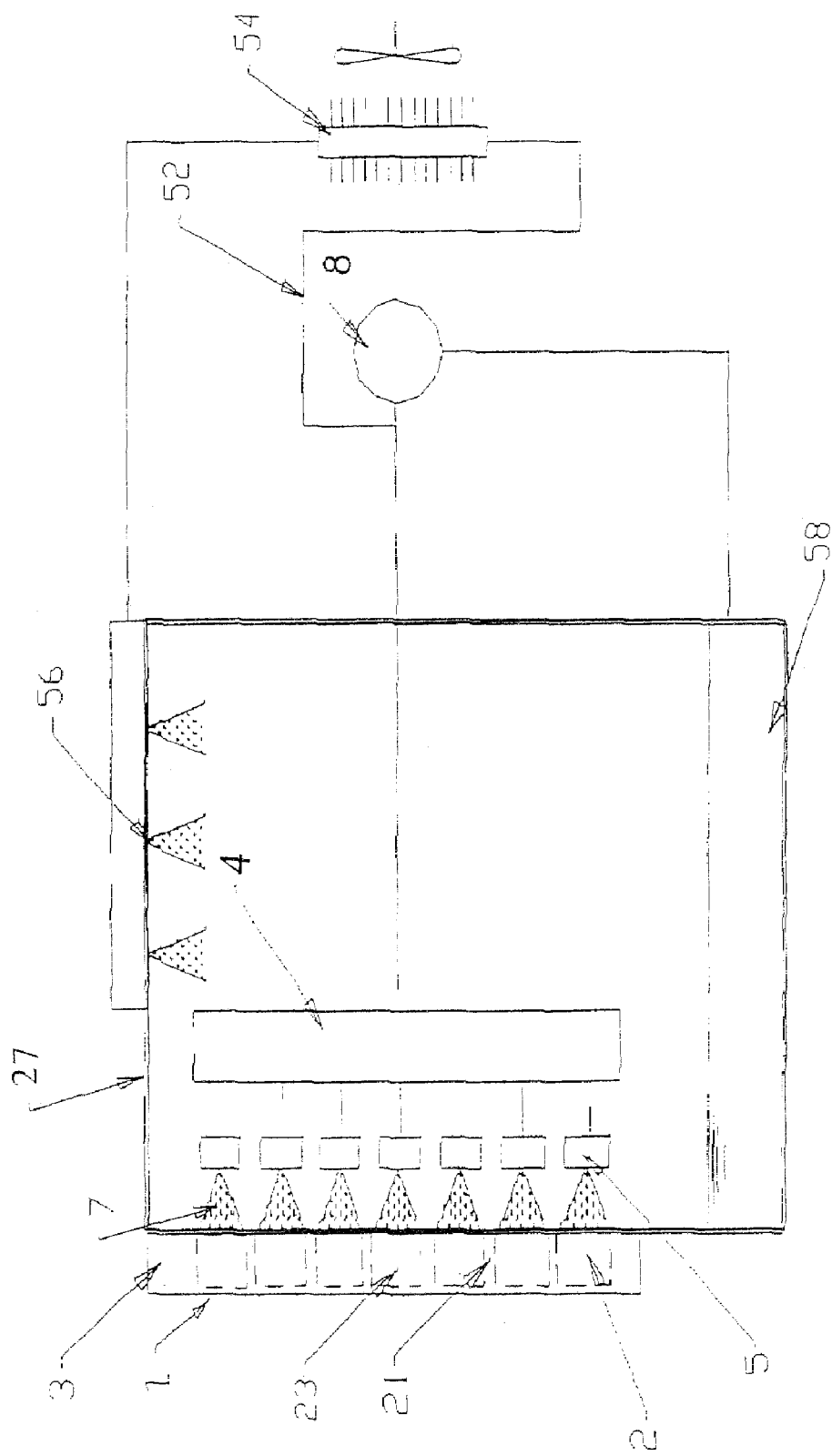
FIG. 5 shows an embodiment of the subject invention incorporating a closed loop structure.

Referring to FIG. 5, a specific embodiment with a closed loop cycle is shown. Spray manifold 4 can be placed within a sealed housing 27. Sealed housing 27 can be any of a variety of shapes and topologies and encapsulates a region where the pressure can be controlled. Interface plate 3 can function as one of the walls of housing 27. The cooling process can be substantially similar to the process described with respect to FIG. 1. The flow pattern can be varied and can vary with the type of nozzle used. In a specific embodiment, pressure atomizer nozzles can be used. Referring back to FIG. 5, liquid coolant can be drawn from reservoir 58 and pressurized via liquid coolant pump 8. Liquid coolant pump 8 can send pressurized liquid coolant into spray nozzle manifold 4. The liquid coolant can be distributed into the array of spray nozzles 5 and sprayed into compartments 23 of the interface plate 3. Interface plate 3, as in the other embodiments of the subject invention, can be a separate plate in thermal contact with a heat source, or can be integral with a heat source, for example, a wall of a device producing heat which needs to be removed. Due to heat supplied by a heat source to surface 1, at least a portion of the liquid coolant can vaporize as it contacts surface 2 of compartment 23. The vapor can then flow into the housing 27. The embodiment shown in FIG. 5 can also be implemented without spray manifold 4 and, instead, with other nozzle options, for example a single nozzle.

To condense the vapor and remove the heat acquired from the heat source, a condenser can be placed within the housing. The condenser can consist of a standard vapor to liquid heat exchanger with cold liquid supplied via a vapor compression cycle to the liquid ports of the heat exchanger. The warm vapor condenses on the heat exchanger, releasing its heat to the vapor compression cycle and flows into the reservoir.

A more efficient method of condensing the vapor and removing the heat involves adding another set of spray nozzles 56 to spray sub-cooled liquid coolant into the housing. A portion of the pressurized liquid from pump 8 can be sent to a heat exchanger 54 via tubing 52, rather than to manifold 4, to sub-cool a portion of the pressurized liquid coolant. Heat exchanger 54 can be, for example, a liquid-to-liquid heat exchanger cooled with liquid on one side of the exchanger. Liquid from a vapor compression cycle can be used for this purpose. If the saturation temperature of the housing 27 is above ambient, the heat exchanger 54 can be a vapor-to-liquid heat exchanger cooled by ambient air. The sub-cooled liquid coolant can then be directed to one or more pressure atomizer nozzles 56 and sprayed within the housing. The saturated vapor generated within the housing can contact the sub-cooled droplets. The saturated vapor can condense on the sub-cooled droplets to form larger droplets, which can flow into the reservoir to be reused in the process.

Figure 6:
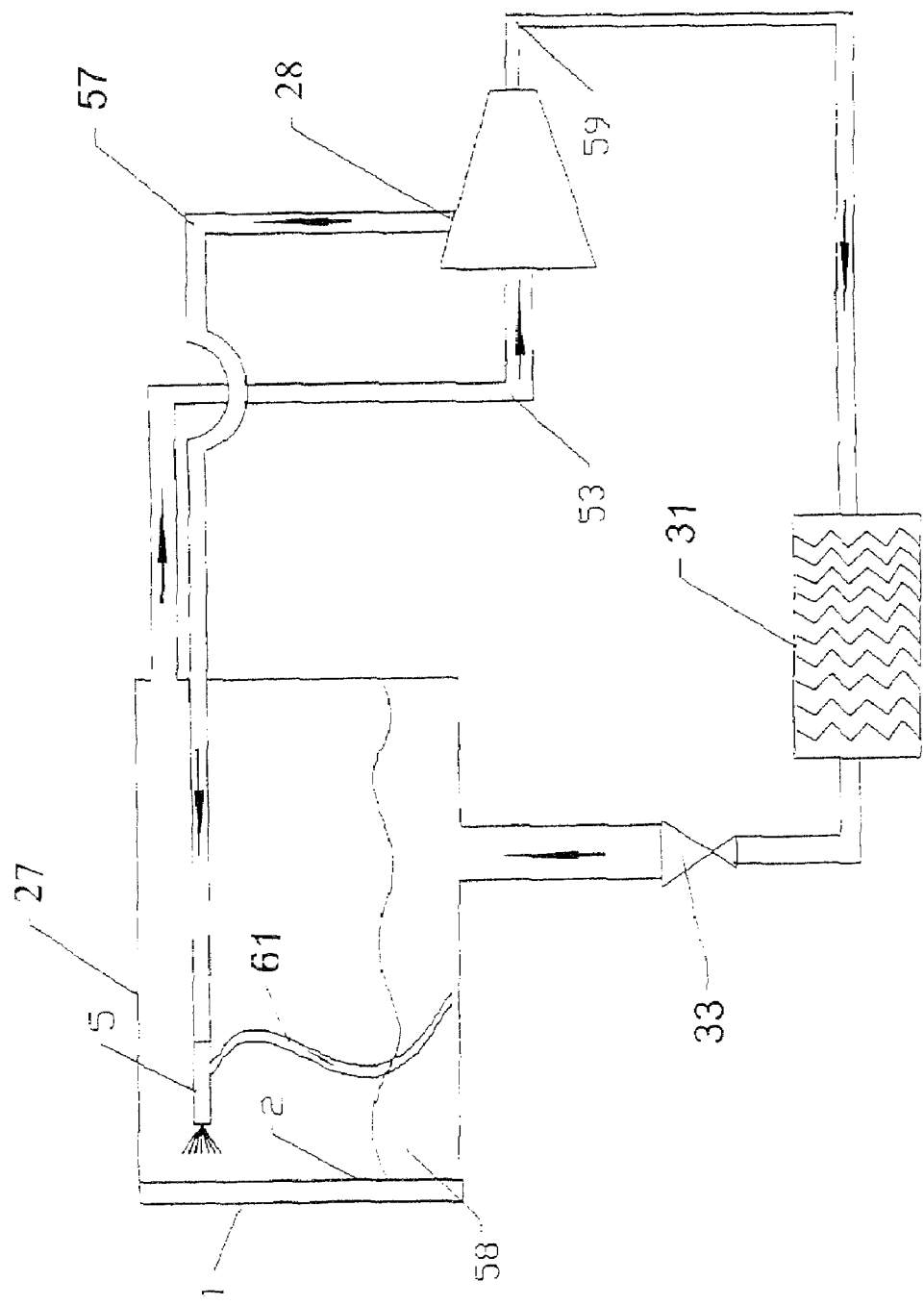
FIG. 6 shows an embodiment of the subject invention in which an evaporative spray cooling loop is combined with a vapor compression cycle.

Referring to FIG. 6, in another specific embodiment of the subject invention, the evaporative spray cooling loop can be combined with the vapor compression cycle. In contrast with the closed loop system previously described with reference to FIG. 5, which used a coolant in the evaporative spray cooling loop to transfer the heat from the heat source to a vapor compression cycle via heat exchanger 54, in the embodiment shown in FIG. 6, the heat exchanger can be removed and a single coolant used. The use of a single coolant in this embodiment can allow for a more efficient and compact system.

Again referring to FIG. 6, the system can utilize a sealed and pressurized evaporator housing 27. A heat source can be thermally coupled to surface 1. Heat coupled to surface 1 can be removed by the evaporation of the coolant sprayed onto surface 2 of the interface plate. Interface plate 3, as in the other embodiments of the subject invention, can be a separate plate in thermal contact with a heat source, or can be integral with a heat source, for example, a wall of a device producing heat which needs to be removed. The vapor generated by the cooling process can be pulled from housing 27 via vapor compressor 28. The vapor can enter vapor compressor 28 through tubing 53 and be pressurized. The vapor compression can have two stages: one for powering one or more spray nozzles 5 through tubing 57 and another to complete the vapor compression cooling cycle through tubing 59. In a specific embodiment, this two stage design can be accomplished with a two stage compressor 28 with outlet ports designed to discharge the compressed vapor at the desired compression ratios. In an alternative embodiment, two compressors can be utilized: the first one compressing to the pressure required to power the spray nozzle and the second for compressing the vapor to desired pressure to complete the vapor compression cycle. In another alternative embodiment, a single stage compressor can be used which compresses all the vapor to the desired pressure for the vapor compression cycle and which bleeds off the portion needed for the spray nozzle through an expansion valve, turbine, or nozzle.

Figure 10A:
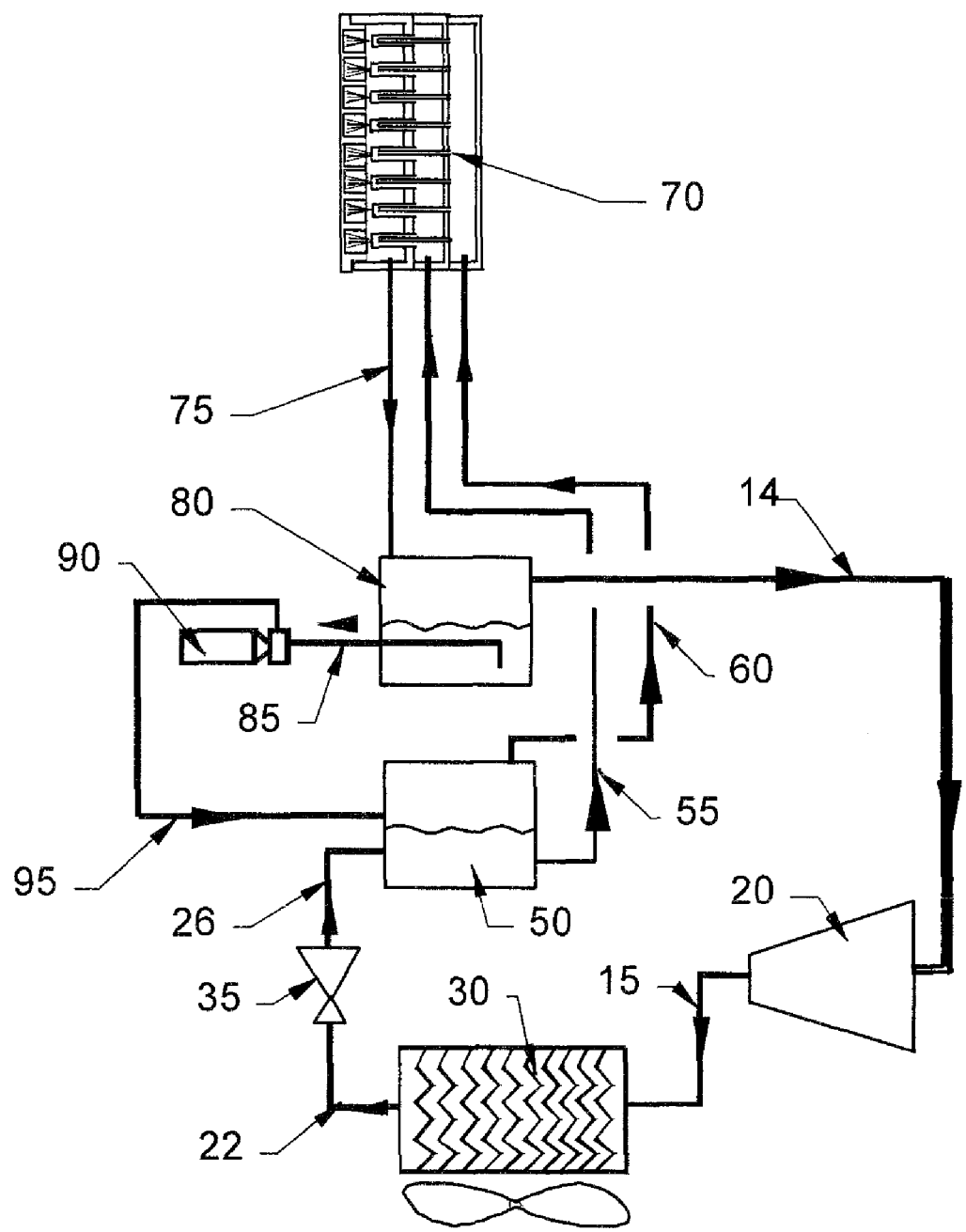
FIG. 10A shows an embodiment of the subject invention in which an evaporative spray cooling loop is combined with a vapor compression cycle, further incorporating an accumulator and a phase separator.
Figure 10B:
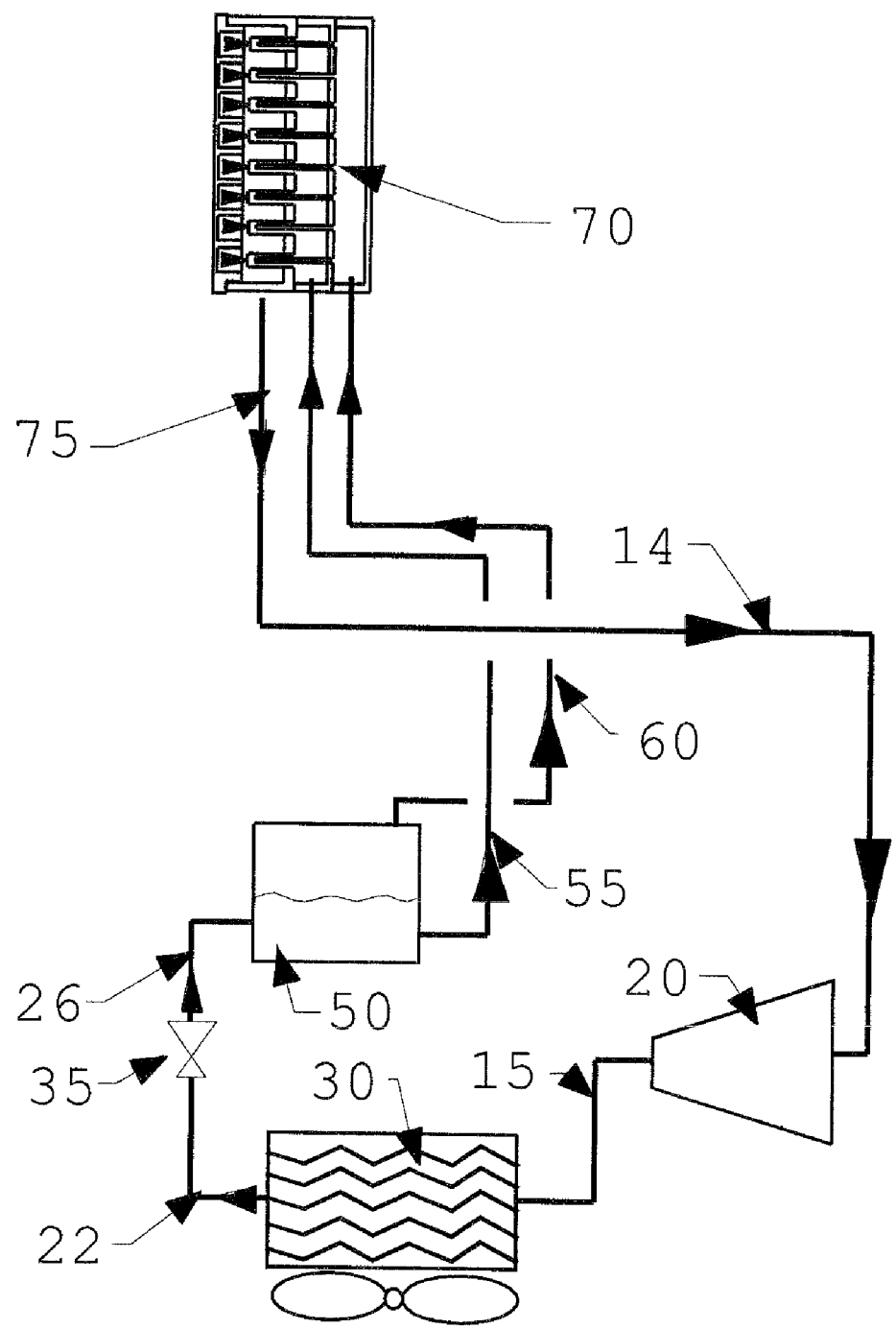
FIG. 10B shows an embodiment of the subject invention in which an evaporative spray cooling loop is combined with a vapor compression cycle, further incorporating a phase separator.

The pressurized vapor used to power the one or more spray nozzles 5 can port directly back into the spray nozzle manifold. Depending on the nozzle used, the liquid from the reservoir 58 can either be pumped to the liquid port of the spray nozzle manifold or sucked through it via venturi action, for example through tubing 61. The second port from compressor 28 can discharge vapor at the desired pressure to complete the vapor compression cooling cycle. The superheated compressed vapor can then be channeled to condenser 31. Within the condenser, which can utilize, for example, an air, gas, or liquid heat exchanger, the high temperature compressed vapor can be cooled and condensed to a saturated liquid. The cooled saturated liquid can exit the condenser and be channeled to an expansion valve, turbine, or nozzle 33. The expansion valve, turbine, or nozzle 33 can cause the pressure of the saturated liquid coolant to drop to the pressure and corresponding saturation temperature of the evaporator housing 27. The mixed quality liquid can then exit the expansion valve, turbine, or nozzle 33 and be channeled to the liquid reservoir 58 waiting to be reused. Using a turbine rather than an expansion valves would allow the recapture of the energy normally lost through the expansion valves. Using a nozzle can allow for direct spraying of the liquid coolant onto heat transfer surface 2 if, for example, a pressure atomizer nozzle is used. Alternatively, with respect to the embodiment shown in FIG. 6, a phase separator 50 as shown in FIG. 10B could be placed after expansion valve 33 and reservoir 58 such that tubing 57 could receive vapor coolant from the phase separator rather than compressor 28.

Example 1

Method for Spray Impingement Heat Exchanger

The system described in this example can utilize the technique of spraying coolant onto a surface in order to transfer heat from the surface to the coolant and can also utilize the spraying of coolant onto a surface to transfer heat from the coolant to the surface. By spraying a first, hot, coolant onto a first surface of a dividing wall and a second coolant onto an opposite surface of the dividing wall, heat can be transferred from the first coolant to the second coolant. In this example, a housing with a dividing wall, two fluid spray nozzle assemblies and two fluid outlets can be utilized. The dividing wall in the housing separates the two flows in the heat exchanger. One fluid is sprayed on one side of the wall and the other is sprayed on the other side of the wall. The intense convection that develops from either the direct impingement and/or the evaporation for a two phase flow design allows for a very small heat exchanger to exchange a considerable amount of heat.

Figure 7:
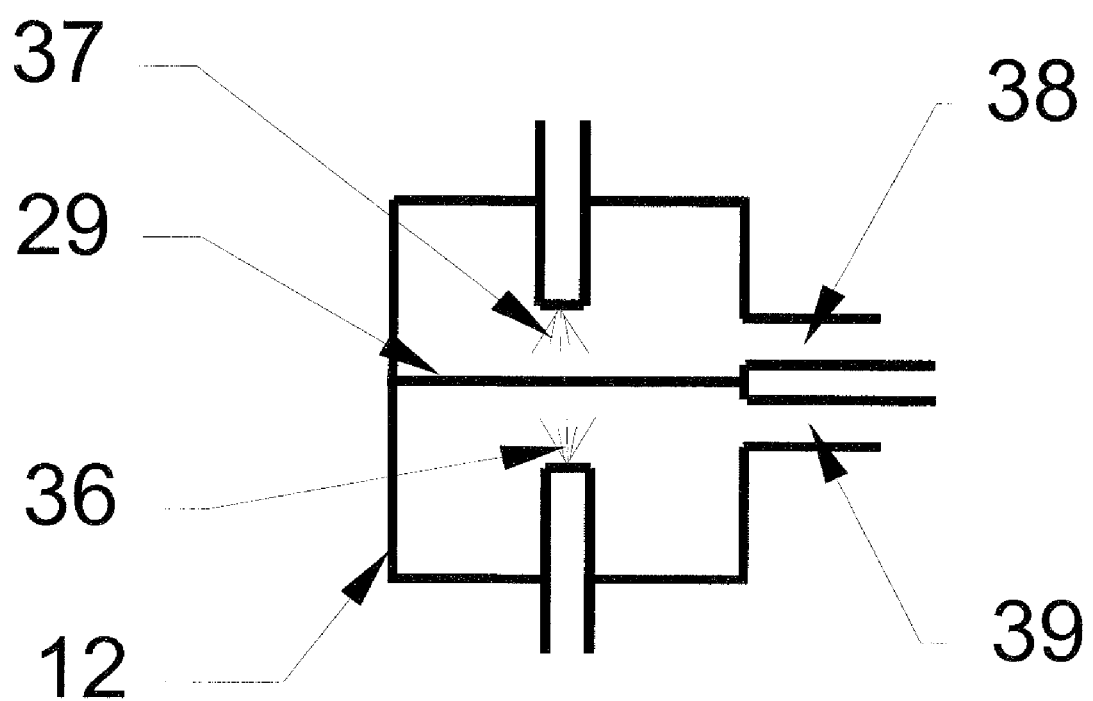
FIG. 7 shows a specific embodiment of a heat exchanger in accordance with the subject invention.

Referring to FIG. 7, a closed housing 12 can incorporate a dividing wall 29 within the housing 12 which separates the housing 12 into two housing compartments. In one of the housing compartments, a spray nozzle or series of spray nozzles 36 can spray a first fluid onto one side of wall 29. The first fluid can leave this housing compartment via outlet port 39. One the other side of the dividing wall 29, a spray nozzle or series of spray nozzles 37 can spray a second fluid onto the dividing wall 29. This second fluid can leave this compartment via outlet port 38. The first and second fluids can be chosen based on their properties, such as boiling point.

Heat can then be transferred between the fluids through wall 29. The convection heat transfer coefficient that is developed with both single phase and two phase spray impingement is very high. This high coefficient allows the heat exchanger to be much more compact in size and efficient when compared to current heat exchanger technology. Wall 29 can be a flat surface or an engineered spray cooling surface such as a honeycomb or cubic chamber style surface, such as described in the subject application. Additionally, fins or other surface extension mechanism can be added to wall 29 to increase the effective surface area to increase the heat transfer through the wall 29.

Example 2

Spray Nozzle Expansion in Vapor Compression Cycle Spray Cooling

The system described in this example can be utilized with various embodiments of the subject invention. Specific embodiments in accordance with the subject invention can comprise three main components: a compressor, a condenser, and a spray cooling expansion valve interface assembly. The cycle can begin with the compressor pulling in coolant vapor from the spray cooling assembly, and the coolant vapor being compressed to a temperature above ambient. The hot vapor can then flow through a heat exchanger to condense the vapor to liquid. The compressed hot liquid can be expanded through a nozzle and sprayed onto the spray cooling interface, or heated surface 2. Interface plate 3, as in the other embodiments of the subject invention, can be a separate plate in thermal contact with a heat source, or can be integral with a heat source, for example, a wall of a device producing heat which needs to be removed. A heat source, such as a laser diode or other heat exchange medium, attached on the other side of the interface can be cooled by the expanding and evaporating liquid. The liquid coolant can be vaporized as it removes the heat from the heat source via the interface. In embodiments where some of the coolant is not vaporized as it departs from the interface, an accumulator can be inserted between the coolant departing the interface and the compressor in order to reduce the amount of, or prevent, liquid coolant from entering the compressor. A transfer pump can be used to transfer excess liquid from the accumulator to the liquid supply line to the nozzle.

Figure 8:
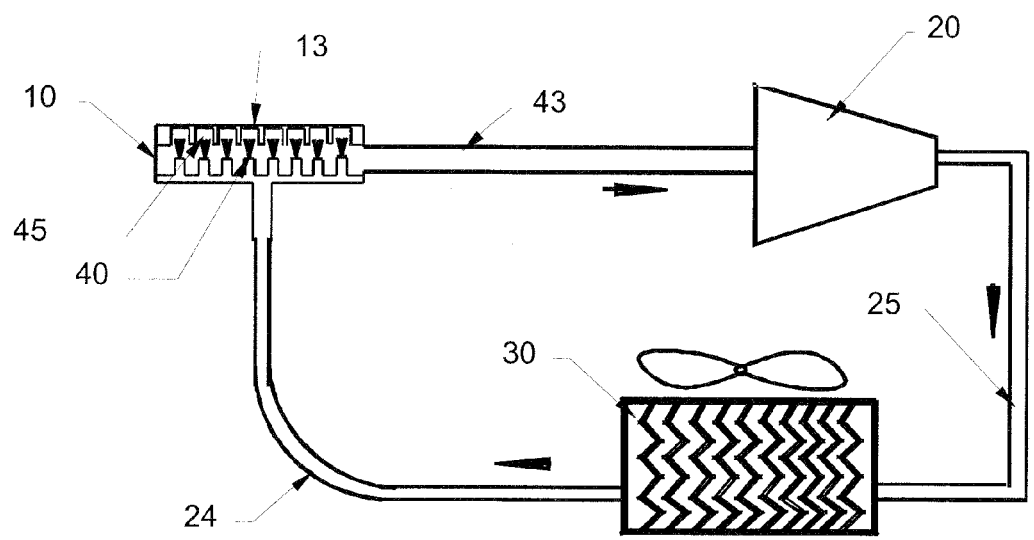
FIG. 8 shows an embodiment of the subject invention in which an evaporative spray cooling loop is combined with a vapor compression cycle.
Figure 9:
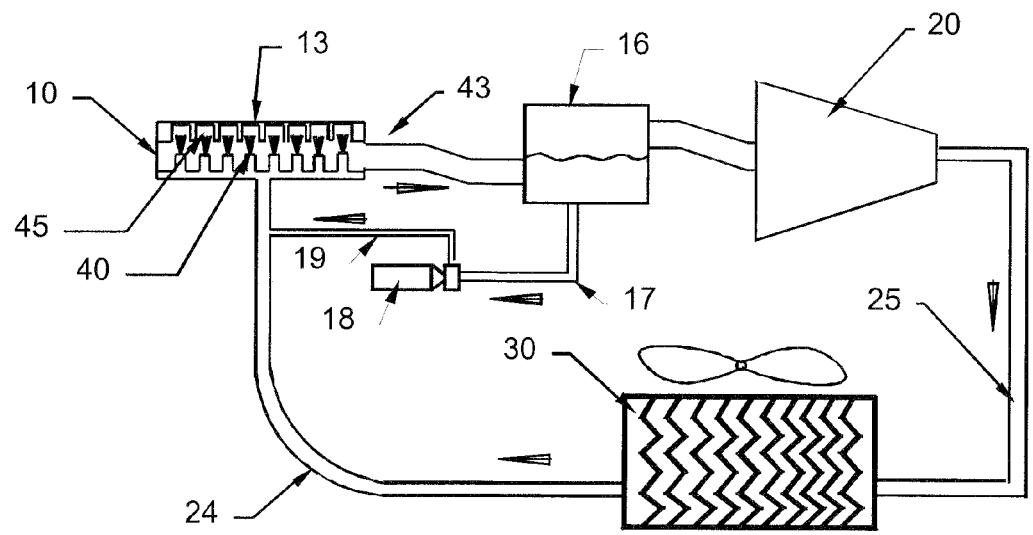
FIG. 9 shows an embodiment of the subject invention in accordance with the embodiment shown in FIG. 8, further incorporating an accumulator.

Referring to FIGS. 8 and 9, the cycle can begin with a spray cooling expansion evaporator 10, which removes heat from a heat source 13. The expansion evaporator 10 can receive pressurized liquid coolant and allow the coolant to expand between entering the nozzle and exiting the nozzle. The nozzle can also atomize the coolant as the coolant exits the nozzle and is sprayed onto the heated surface. As the liquid coolant is sprayed onto the heated interface wall 45 the coolant can vaporize as it gains heat. Interface wall 45, as in the other embodiments of the subject invention, can be a separate plate in thermal contact with a heat source, or can be integral with a heat source, for example, a wall of a device producing heat which needs to be removed. The vaporized coolant can flow from the expansion evaporator via connection piping 43 to a compressor 20. The compressor compresses the vapor coolant to a temperature above the temperature of the condenser 30 coolant flow. The compressed hot vaporized coolant can flow from the compressor 20 to the condenser 30 via connecting pipe 25. The condenser 30 can be a heat exchanger of any type designed to remove heat from a vaporized coolant, such as an ambient air to liquid heat exchanger. The pressurized hot coolant vapor is cooled in the condenser 30 and condenses to liquid as its heat is removed. The pressurized liquid coolant can flow from the condenser 30 via connecting pipe 24 to the spray cooling expansion evaporator 10 inlet. The expansion evaporator 10 can comprise a nozzle or a series of nozzles 40 which can spray the pressurized liquid coolant on to the heat interface wall 45. The cycle can then begin again and can run in a continuous loop while cooling is desired.

Under some operating conditions, excess liquid can be sprayed from the impingement nozzle 40 for enhanced heat transfer. In this case, accumulator 16, as shown in FIG. 9, may be added on line 43. The accumulator can retain excess liquid in line 43 from entering compressor 20. Liquid coolant can accumulate in accumulator 16. A liquid pump 18 can pump the excess liquid from accumulator 16 via connecting line 17 to the liquid supply line 24 via pump discharge connecting line 19.

Example 3

Phase Separator for Spray Impingement Evaporator for Vapor Compression Cycle This example describes a phase separator 50 which can be utilized with subject spray impingement evaporator 70 for vapor compression cycles in accordance with the subject invention. FIG. 10A shows a specific embodiment of the subject invention that incorporates a phase separator 50 in conjunction with a spray impingement evaporator 70. A spray impingement evaporator 70 can be added to a vapor compression cycle to improve the heat transfer capabilities of the evaporator. The process can begin with a compressor 20 taking in vapor from an accumulator 80. The compressed hot vapor exiting the compressor 20 goes to a condenser 30 to change the phase of the vapor to liquid. The liquid can then be expanded through an expansion valve 35. As liquid coolant is pumped from the accumulator 80 to the phase separator 50, the liquid in the phase separator 50 can be at a higher pressure than in the accumulator 80 which receives vapor and liquid coolant from the impingement evaporator 70 through, for example, tubing 75. The cooled liquid can then be used in a spray impingement evaporator 70.

The addition of the phase separator 50 in this cycle in accordance with this example can allow the process to use at least a portion of the energy normally wasted in the expansion device to power the spray nozzles. The process enhancement can add the phase separator 50 after the expansion valve 35. However, in this case the pressure drop across the expansion valve 35 can be small. This allows a liquid vapor mixture at high pressure to collect in the phase separator 50. The high pressure fluid can then be used directly to power the spray nozzle in the spray impingement evaporator 70. Since the fluid is in both liquid and vapor phase, either a pressure atomizer or vapor atomizing nozzle can be used in the evaporator. A transfer pump 90 may be used to transfer excess liquid from the accumulator 80 to the phase separator 50.

Referring to FIG. 10A, the process can begin with a coolant vapor flowing from an accumulator 80 via compressor intake line 14 to the compressor 20. The vaporized coolant can be pressurized causing the temperature to rise. The hot coolant vapor can flow from the compressor 20 to the condenser 30 via connection line 15. The condenser 30 is a heat exchanger designed to remove heat from the hot vapor causing it to change phase to liquid. Condenser 30 can be any type of heat exchanging device, such as an air to liquid style allowing the heat to be pumped into ambient air, or any other medium that is at a colder temperature than the condensing temperature of the coolant. The compressed liquid coolant can flow from the condenser 30 to the expansion device 35 via connecting line 22. The expansion of the compressed liquid coolant can cause it to vaporize and cool. The mixed phase coolant can flow from the expansion device 35 via connecting line 26 to the phase separator 50. The expansion permitted in the expansion device 35 can be limited as compared to a conventional vapor compression cycle so that the pressure within the phase separator 50 is higher than the pressure in the accumulator 80. As liquid coolant is pumped from the accumulator 80 to the phase separator 50, the liquid in the phase separator can be at a higher pressure than in the accumulator 80 which receives vapor and liquid coolant from the impingement evaporator 70 through, for example, tubing 75.

Figure 13:
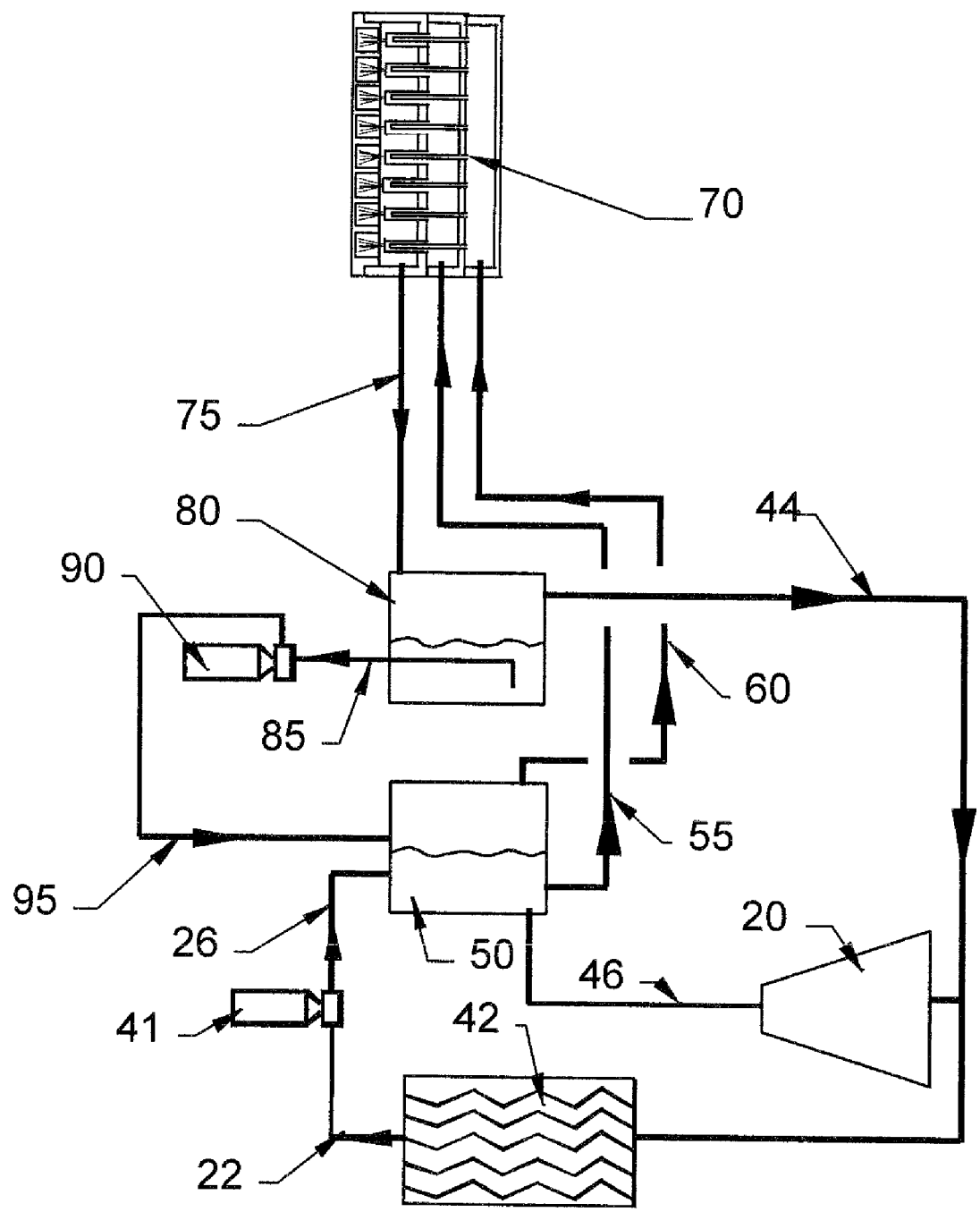
FIG. 13 shows a schematic diagram of a cooling system in accordance with the subject invention, which incorporates a thermal energy storage unit.
Figure 14:
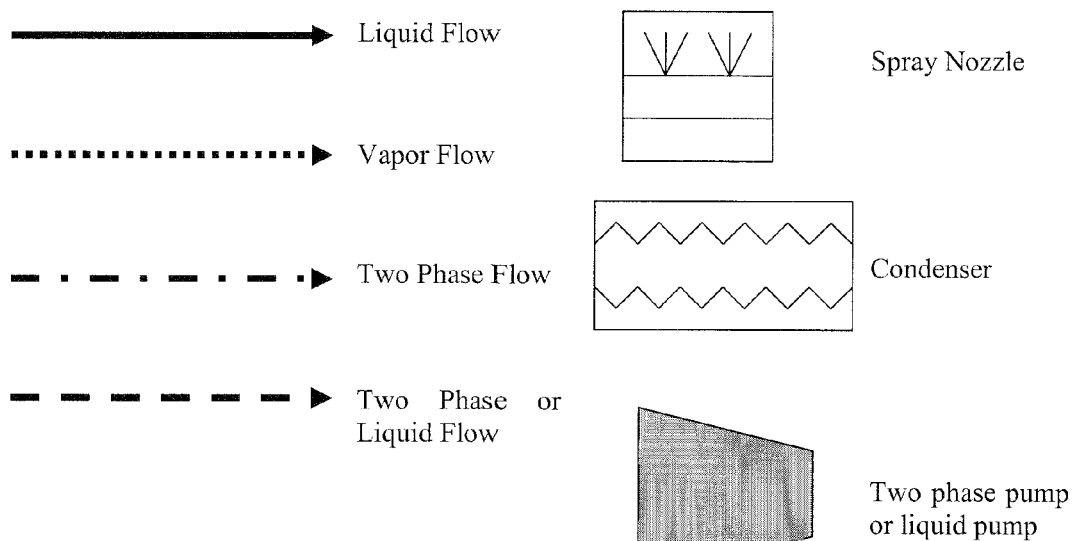
FIG. 14 shows a diagram key for FIGS. 15-31.
Figure 14:
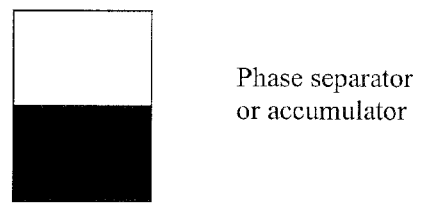
Figure 14:
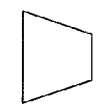
Figure 14:

The phase separator 50 can separate the phases to liquid and vapor. The phase separator 50 and accumulator 80 rely on the densities of the fluids within them and gravity to separate the fluids into vapor and liquid phases. A typical design can be a cylindrical, spherical, or box shape. Both components have an inlet port that flow both liquid and vapor. The outlets ports are then positioned so that individual phases leave the component. The spray cooling cycle, for example as shown in FIGS. 10A, 10B, and 13, may have applications, such as space applications, where gravity is low or not available. For zero gravity or low gravity applications, a separating force can be applied to the internal fluids to separate the phases. Such forces can be, for example, centrifugal such as those produced by a rotating drum.

The liquid coolant can flow from the bottom of the phase separator 50 via connecting line 55 to the spray nozzle liquid inlet port in the spray impingement evaporator 70. The spray impingement evaporator 70 can incorporate an interface plate 3 as discussed with respect to FIG. 1 and others. Interface plate 3, as in the other embodiments of the subject invention, can be a separate plate in thermal contact with a heat source, or can be integral with a heat source, for example, a wall of a device producing heat which needs to be removed. The vapor coolant from the phase separator 50 can flow via vapor connecting line 60 to either the vapor inlet port of the spray nozzle or directly to the accumulator 80 depending on the type of nozzle used in the spray impingement evaporator 70. The liquid coolant gains heat in the evaporator 70 and vaporizes. The vaporized coolant and excess liquid can flow from the spray impingement evaporator 70, via connecting line 75, to the accumulator 80. A transfer pump 90 may be added to the cycle to transfer excess liquid from the accumulator 80 via connecting line 85 to the phase separator 50 via connecting pipe 95.

Referring to FIG. 10A, but not limited to the embodiment shown in FIG. 10A, spray impingement evaporator 70 is shown connected to the vapor compression cycle via lines 55, 60, and 75. In this way the spraying and vapor compression functions can be geographically separated. This can allow a smaller housing for spray impingement evaporator 70 which takes up less space and can be more conveniently brought into contact with heat sources where space can be a premium. In addition, a plurality of spray impingement evaporators 70 can be connected to a single vapor compression cycle system through a corresponding plurality of lines corresponding to lines 55, 60, and 75. The physical separation of the spraying and vapor compression functions can be accomplished in the other embodiments described in the subject application. Again, spray impingement evaporator 70 can utilize one of a variety of nozzle types as described in the subject application. Also, as other embodiments described in the subject application utilized an essentially gravity-based phase separator, the phase separator 50 shown in FIG. 10A could also be utilized with these embodiments.

In the embodiment shown FIG. 10B, compared with the embodiment shown in FIG. 10A, the accumulator 80 and transfer pump 90 have been removed from the embodiment shown in FIG. 10A. As a result, the coolant in tube 75 connects directly to tube 14 and is transported to the compressor 20. In an embodiment where compressor 20 is a style of compressor that can only except vapor at its inlet, then the coolant in tube 14 can be all vapor. In such an embodiment, if any liquid remains in tube 75 as a result of the spray cooling process, then this liquid can be vaporized before entering the compressor. In another embodiment where less than all the spray cooling liquid is vaporized in the spray cooling process, and a means to vaporize the remaining liquid in tube 75 is not desired, a compressor 20 that can except a portion of liquid at its inlet can be used.

Example 4

Surface Area Enhancement for Heat Transfer Surfaces

The subject invention also relates to a heat transfer apparatus having an enhanced surface which can increase the rate of heat transfer from the surface to an impinging fluid. The subject enhanced surface can be incorporated with any of the heat transferred surfaces disclosed in the subject patent application or incorporated with other heat transfer surfaces. The subject invention also pertains to heat transfer apparatus, such as heat transfer plates, which incorporate the subject enhanced surfaces. The subject enhanced surfaces can also be utilized for heat desorption from a surface.

Figure 11:
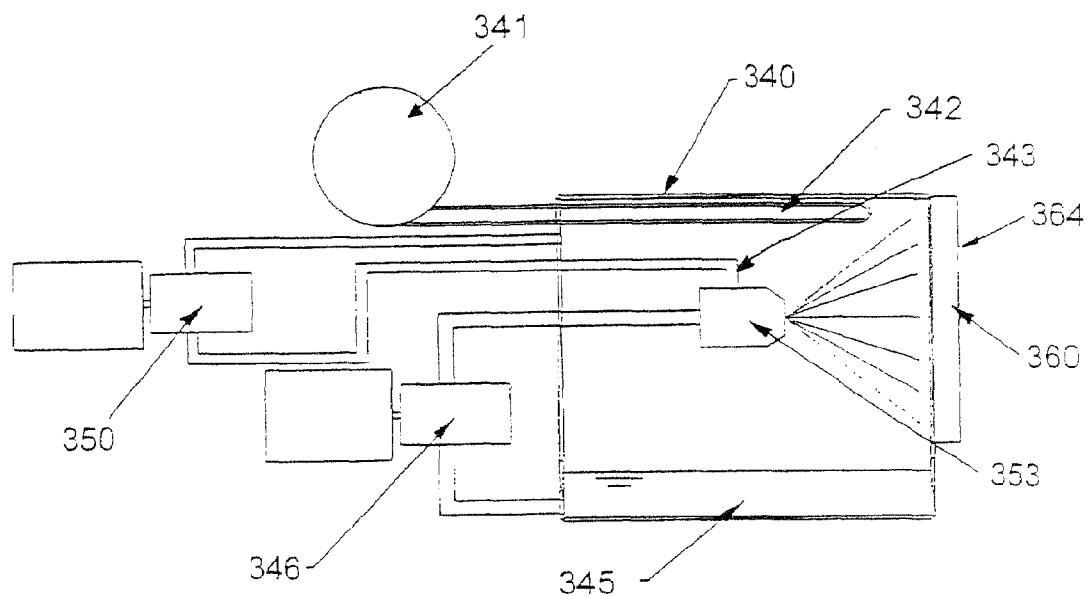
FIG. 11 shows a schematic diagram of a cooling system in accordance with the subject invention.

In a specific embodiment, the subject system can comprise: a housing, a fluid pump or compressor, a nozzle array consisting of one or more nozzles, and a high heat flux source interface plate. The process begins with the housing. The housing contains the working fluid. The process as shown in FIG. 11 begins with the entire assembly placed within a housing 340. The housing is then filled with the desired coolant to a level which allows an adequate pumping reservoir 345 without impending on the coolant flow. A pump or compressor draws the coolant from the housing and pressurizes it. The pressurized coolant is forced through the nozzle array. The nozzles atomize the coolant onto the heated surface to remove heat from the heat source 364. The surface is enhanced to increase the effective cooling area of the spray.

Evaporative spray cooling is enhanced by maintaining the thinnest liquid layer possible on the heat transfer surface. Pressure atomizer nozzles use high pressure liquid and vapor atomizer nozzles use compressed vapor to atomize the liquid coolant. Both types of nozzles can be used to produce a high velocity and lower droplet density spray. The result is a spray of liquid coolant onto the extended surface area which takes advantage of the additional surface area.

The pump 346 draws in the liquid coolant and pressurizes it to the desired pressure. The pressurized liquid goes to the liquid inlet port of spray nozzle 353. Compressor 350 draws in coolant vapor and pressurizes it to the desired pressure. The pressurized coolant vapor is sent to the vapor inlet port 343 on spray nozzle 353. The compressed vapor and the pressurized liquid coolant combine in nozzle 353 to form small liquid droplets with a high velocity.

The spray nozzle 353 can be a vapor atomizer nozzle as shown using both compressed vapor and liquid coolant or a pressure atomizer nozzle, not shown, which uses only pressurized liquid.

Figure 12A:
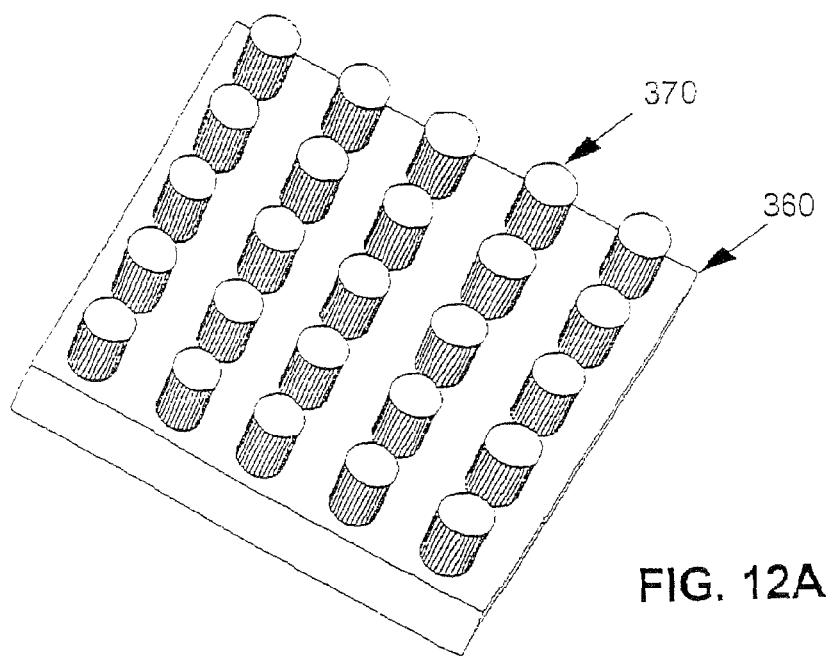
FIGS. 12A-12E show a heat transfer surface incorporating surface enhancement in accordance with the subject invention.
Figure 12B:
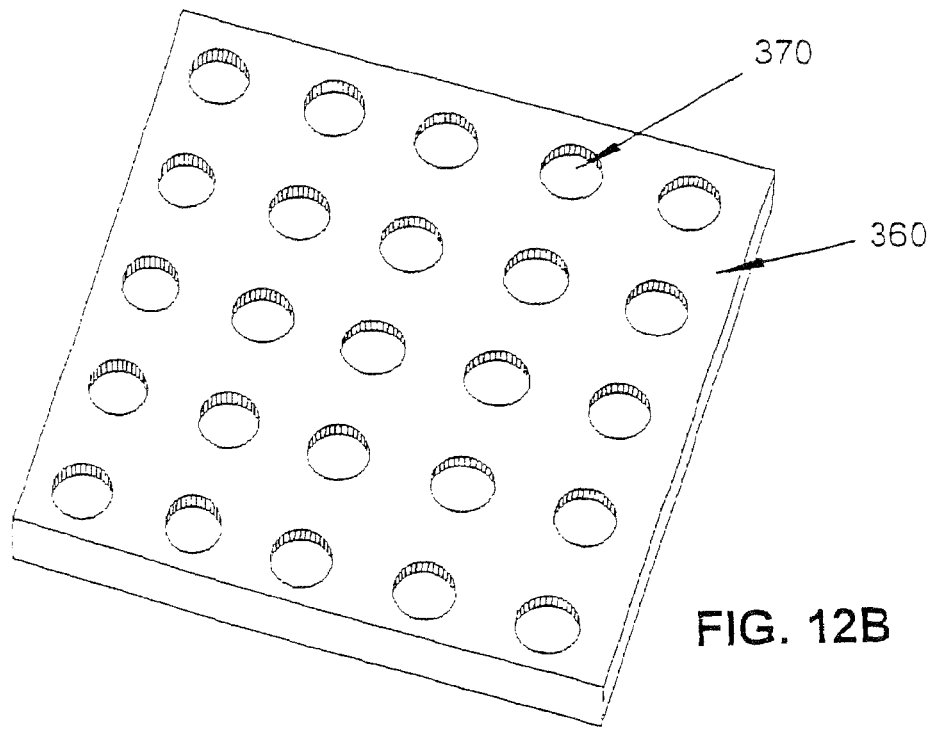
Figure 12C:
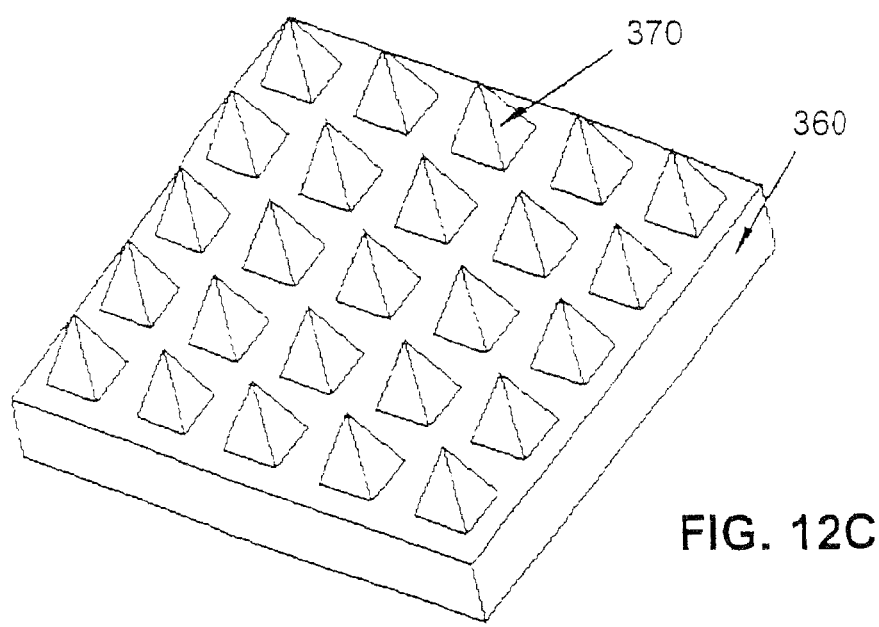
Figure 12D:
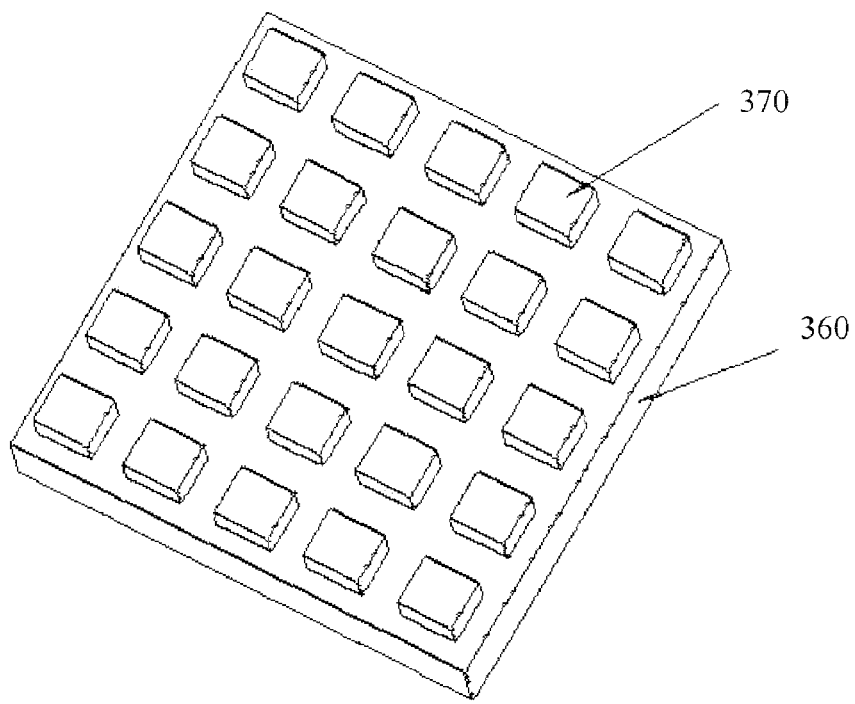
Figure 12E:
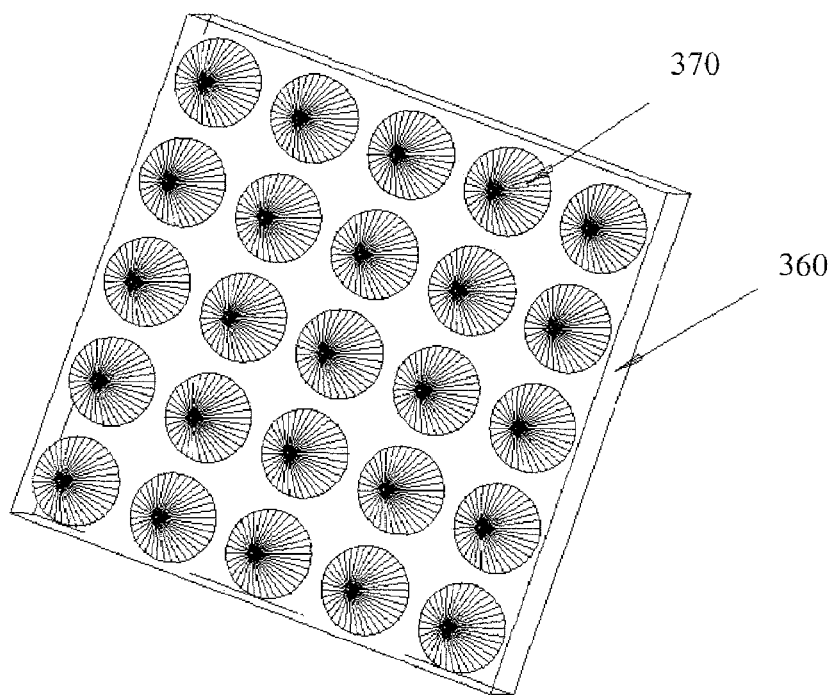

The droplets impinge on cooling plate 360. Multiple surface area enhancements 370 are connected to cooling plate 360 as shown in FIGS. 12A-12E. The enhancements can be milled into or extend from the surface or can be thermally attached to the surface 360. The enhancements can be protrusions from surface 360 as shown in FIG. 12A or indentations into surface 360 as shown in FIG. 12B. The enhancements can be of any shape including but not limited to rods, cubes, cones, or pyramids. FIGS. 12A-12E show variations of possible surface enhancements that improve spray cooling. However, any geometric shape or combination of shapes intruded into and extended from the surface can be used as surface enhancements. The subject protrusions and/or indentations can be created by, for example, sandblasting the surface. In addition, the subject enhanced surfaces with protrusions and/ or indentations can also be sandblasted to increase the heat transfer properties of the surface.

In a specific embodiment, protrusions, and/or indentations, having a height and/or depth, to diameter ratio of between about 0 to about 10 can be utilized. In further specific embodiments, a height, and/or depth, to diameter ratio of between about 1 and about 5 can be utilized. In another embodiment, protrusions, and/or indentations, having a height to spacing between adjacent protrusions, and/or indentations, ratio of between about 2 and 4 can be utilized. In a further embodiment, a height, and/or depth, to diameter ratio of about 3 can be utilized. In a specific embodiment, the number of protrusions, and/or indentations, density/spray cooling area is between about 1 and about 100 per square centimeter. In a farther specific embodiment, the number of protrusions, and/ or indentations, density/spray cooling area is between about 10 and about 20 per square centimeter. In a specific embodiment, the subject surface enhancements can increase the surface area, as compared to a smooth surface, by about 1 to about 5 times. In a further specific embodiment, the subject surface enhancements can increase the surface area by about 1.1 to about 2. In a specific embodiment, the center to center spacing of the subject protrusions, and/or indentations is between about (0.1) d and about 10d, where d is the diameter (or mean diameter) of the protrusions, and/or indentations. In a further specific embodiment, the center to center spacing is about d. In a specific embodiment, the roughness of the subject enhanced surface can have a RMS of between about optically smooth and about 100 micrometers.

The vapor coolant can then flow to a condenser, such as coil 342. The vapor condenses on the condenser coil 342 and forms liquid. The liquid then flows into reservoir 345. A heat extractor 341 removes the heat from the condenser 342 via thermal connection. The heat extraction can be a refrigeration cycle or an ambient heat exchanger.

A series of control devices including thermocouples, flow meters and level indicators are used to control the process in order to maintain the desired operating conditions.

The cycles shown in FIGS. 6, 8, 9, 10A, 10B, and 13 can utilize control features to maintain operating conditions. For spray cooling, maintaining a constant temperature of the cooled device can be important. Therefore, the control system can monitor the conditions within the cycle and make the proper adjustments.

The control system can be an active electronic system using electronically actuated valves and temperature and pressure sensors. A computer operated device, such as a Programmable Logic Controller can monitor the sensors and make adjustments to the control valves to maintain conditions. In addition, the control system can utilize smart valves that mechanically monitor the cycle conditions and change port settings due to mechanical or thermal forces. The control system can also utilize a combination of both mechanically activated and electronically activated valves.

Example 5

Thermal Energy Storage Unit

The subject invention can incorporate thermal energy storage device designed to collect thermal energy when energy is present and store it for use or dissipation at a later time. The subject invention can utilize a thermal energy storage device which relies on sensible heat transfer and storage and/or latent heat transfer and storage. The temperature of the storage media can vary depending on the type of storage used. For the purpose of spray cooling, latent heat storage that produces a near constant temperature is the most practical. However, sensible heat storage can also be used. The use of thermal energy storage permits the removal of heat energy from the condenser in a vapor compression cycle without requiring high pressure hot vapor. This is a particular benefit when spray cooling is adapted to high energy laser that have a short cycle time. Since it is preferable for high energy electronics to be cooled in real time, the thermal management system preferably removes the heat in real time. If the system is continuous duty, the heat dissipation from the cooling cycle should match the heat generation. However, if the heat generation occurs over short bursts, the heat dissipation can be sized to the average heat generation, provided a thermal energy storage device is available to store the peak loading.

Figure 30:
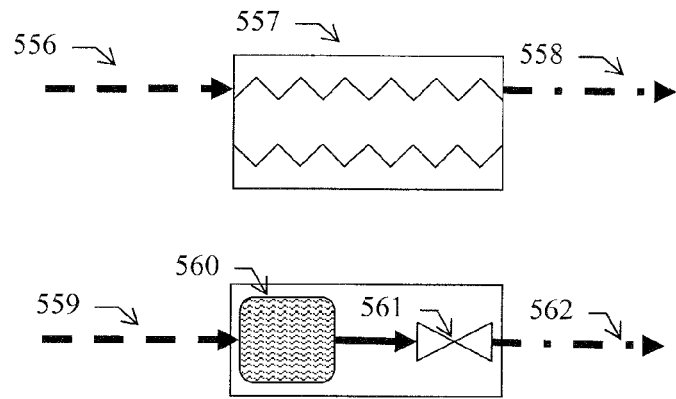
FIG. 30 shows an embodiment of a condenser expansion valve in accordance with the subject invention.

In specific embodiments of the subject invention the condenser, shown as 31 in FIG. 6 and 30 in FIGS. 8, 9, 10A, and 10B, can be replaced with a thermal energy storage unit. FIG. 13 shows an embodiment of the subject invention using thermal energy storage 42 rather than a standard condenser.

The cycle presented in FIG. 13 takes full advantage of a thermal energy storage (TES) unit 42. As long as the TES is lower in temperature than the spray cooling liquid, vapor will flow via connection tube 44 to the TES unit 42. Since the temperature inside the TES is lower, the vapor will condense to liquid. The expansion valve 35 in FIG. 10A is replaced with a small pump 41 in FIG. 13 to pump the liquid from the TES 42 to the phase separator 50. Since high temperature compressed vapor is no longer needed for condensing in a standard vapor compression cycle condenser, the compressor's only purpose is to produce cool, low pressure vapor for the nozzles. Therefore, compressor 20 draws in cool vapor from connection tube 44 and compresses it slightly. The slightly compressed vapor then ports to phase separator 50. The compressor 20 can also port directly to the vapor inlet port of the spray nozzles. In a specific embodiment, the compressor 20 increases the pressure of the vapor by 5 to 20 psi.

The subject invention relates to a closed cycle spray cooling loop. The subject spray cooling cycle cools a heat source and rejects that heat from the cycle. The cycle can be configured using to accomplish one or more of the following: 1. spraying coolant onto a surface to be cooled; 2. pumping the coolant through the flow loop; 3. rejecting heat from the closed loop; and 4. re-condensing the evaporated coolant. The particular arrangement of the components and the specific embodiment of each component can vary depending on the application and requirements of the system. In addition, other optional components may be added. Such optional components can accomplish, for example, one or more of the following: 5. phase separation of liquid and vapor; 6. expansion/diffusion of high pressure coolant; and 7. sub-cooling of input liquid to spray nozzle.

An embodiment of the subject invention can incorporate a means for spraying the coolant onto a surface to be cooled. A spray nozzle can be utilized, where the spray nozzle can be a single nozzle or an array of nozzles. Examples of such spray nozzles are shown in FIGS. 1-4. The nozzle can be, for example, a pressure atomizer nozzle, a vapor assist nozzle, or a two phase flow nozzle. A two phase flow nozzle is one that can input a mixed flow. The inlet to the nozzle may be liquid, separated vapor and liquid flows, or two phase flow. If a pressure atomizer nozzle is used the coolant inputted to the nozzle is preferably a pure single phase liquid. An embodiment that can incorporate a pressure atomizer nozzle is shown in FIG. 5, where single phase liquid can flow through the tube connecting the pump 8 and pressure atomizing nozzle 5. As is shown in FIG. 5, a single tube can transport liquid coolant to the nozzle 5. If a vapor assist nozzle is used, the coolant inputted into the nozzle 5 is preferably both single phase liquid and single phase gas, preferably transported in separate tubes. An embodiment that can incorporate a vapor assist nozzle is shown in FIG. 10A, where single phase liquid can flow through tube 55 and single phase can vapor flow through tube 60 to the vapor assist nozzle in the expansion evaporator 70. An embodiment that can incorporate a two phase nozzle is shown in FIG. 8. A single tube can transport a mix of liquid and vapor in tube 24 to the nozzle 40. The coolant sprayed onto the surface acquires the heat at the surface 13 resulting in two phase spray cooling heat transfer.

An embodiment of the subject invention can incorporate a means to pump the coolant. A pump can be used for this purpose, where a pump is any type which can move liquid and/or vapor, either together or separately. Examples of a liquid pump include, but are not limited to, a rotary vane pump, a gear pump, and a piston pump. Examples of vapor pumps include, but are not limited to, a piston pump, a centrifugal pump, and a Wankel compressor. Examples of mixed flow pumps include, but are not limited to, a diaphragm pump, and a positive displacement pump. Numerous types of pumps are known to those skilled in the art can be used, depending on the coolant liquid/vapor phase and depending on the configuration of the cycle. In an embodiment utilizing a two phase nozzle, a two phase pump may be used. An example of this is shown in FIG. 8 where compressor 20 can be a two phase pump, where two phase flow enters from the exit of the nozzle through 43 and exits the pump 20 as two phase through line 25. If a vapor assist nozzle is used then both a compressor and pump can be used. An embodiment that can use a combined pump and compressor to power the flow of the cycle is shown in FIG. 10A. In this embodiment, liquid pump 90 and vapor compressor 20 work together to pressurize the inlets 55 and 60 to the nozzle 70. A cycle may also use a compressor alone as in FIG. 10B where the compressor 20 pressurizes vapor that is condensed and expanded to provide pressurized vapor and liquid to the nozzle 70.

An embodiment can utilize a means to reject heat. Any heat exchanger that interfaces with a heat sink can be utilized. An example of such a heat exchanger is shown in FIG. 5, where heat is removed from the working fluid with heat exchanger 54. Heat can be rejected to a heat sink that operates at a colder temperature than the working fluid.

An embodiment can utilize a means to re-condense the evaporated liquid. Any condenser can be utilized. Most commonly the heat rejection and condensation process is simultaneous. An example of this is shown in FIG. 9 where vapor enters the condenser 30 through 25 and exits as a liquid through line 24. While traveling through the condenser heat is rejected from the cycle to a heat sink. Condensation can also be done by sub-cooled spray in a saturated vapor environment as shown by 56 in FIG. 5.

An embodiment can utilize phase separation. A phase separator or accumulator can be utilized for phase separation. A phase separator can be used at any point in the cycle when a mixed flow of liquid and vapor need to be separated into distinct individual flows to accommodate the next device in the flow loop. An example is shown in FIG. 10A, where the phase separator 50 has inputs of two phase and liquid through lines 26 and 95, respectively. The phase separator then outputs separated liquid and vapor flows to the nozzle through lines 55 and 60, respectively. Another example is also shown in FIG. 10A, when the mixed flow in tube 75 is separated into individual flows of liquid and vapor to accommodate the choice of selecting a liquid pump and a vapor pump that can only move liquid and vapor, not a mixed flow. However, if a single mixed flow pump is selected, as shown in FIG. 8, then a phase separator is not needed. The phase separator and accumulator can rely on the densities of the fluids within them and gravity to separate the fluids into vapor and liquid phases. A typical design can be a cylindrical, spherical, or box shape. Both components have an inlet port that flow both liquid and vapor. The outlet ports are then positioned so that individual phases leave the component. The spray cooling cycle, for example as shown in FIG. 10A may have applications, such as space applications, where gravity is low or not available. For zero gravity or low gravity applications, a separation force can be applied to the internal fluids to separate the phases. Such forces can be, for example, centrifugal such as those produced by a rotation drum.

An embodiment can utilize expansion/diffusion. A valve can be used for expansion/diffusion. Expansion of a saturated liquid typically produces some vapor, creating a two phase flow. An example of an expansion valve is shown in FIG. 10A as 35 where single phase liquid exits the condenser 30 through line 22 at a high pressure. The expansion valve 35 lowers the pressure to the desired inlet conditions of the nozzle evaporator 70. An expansion valve 35 is used to allow the condenser 30 to operate at higher pressure than the spray process requires. This strategy allows adaptation to higher temperature heat sinks; by increasing the pressure of the working fluid, the temperature is also increased. In this way, the temperature can be increased above the heat sink more easily.

An embodiment can utilize sub-cooling input liquid to the nozzle. A heat exchanger that can transfer heat and maintain separation of two flows can be used for sub-cooling input liquid to the nozzle. Sub-cooling of the input liquid coolant to the nozzle can be accomplished using the cold two phase flow exiting the nozzle. This can be used to help prevent boiling and/or re-condense any liquid that did boil while transferring to the nozzle. An embodiment utilizing this technique is diagramed in FIG. 31 where the input vapor 569 enters a nozzle 564 directly, and the input liquid 567 enters a heat exchanger 565 and either condenses bubbles which were flowing or cools the liquid to prevent any bubbles. This can ensure that the tube 568 will carry single phase liquid to the nozzle 564. The heat is transferred to the two phase flow 566 exiting the nozzle. Since the two phase flow is saturated it will typically increase in quality as it flows through the heat exchanger 565. Unless all the liquid is evaporated, the temperature of the exhaust flow 566 will remain constant throughout the heat exchanger 565.

The cycle shown in FIG. 5, incorporates a phase separator component, which is needed because the exhaust of the nozzle is two phase. Therefore, liquid is separated from the vapor and sent to the pump. The subject invention relates to a variety of combinations of component order and configuration so that many different cycle variations may be achieved.

Condenser Configurations

Spray cooling can capitalize on the benefits of phase change heat removal such that the spray cooling cycle has a mix of vapor and liquid at some point in the cycle. The ratio of vapor mass to the total flow mass flowing through a tube can be defined as the quality of the two phase flow. For example, a low quality (high concentration of liquid) flow can enter a two phase nozzle and exit from the sprayed surface a high quality flow (high concentration of vapor) due to liquid coolant evaporation in the nozzle. The evaporated liquid is what caries the heat that was acquired from the surface. In other words, re-condensing the evaporated liquid will reject the acquired heat. Therefore, a condenser serves to reject the proper amount of heat by condensing the evaporated liquid and, preferably, all of the evaporated liquid.

Figure 18:
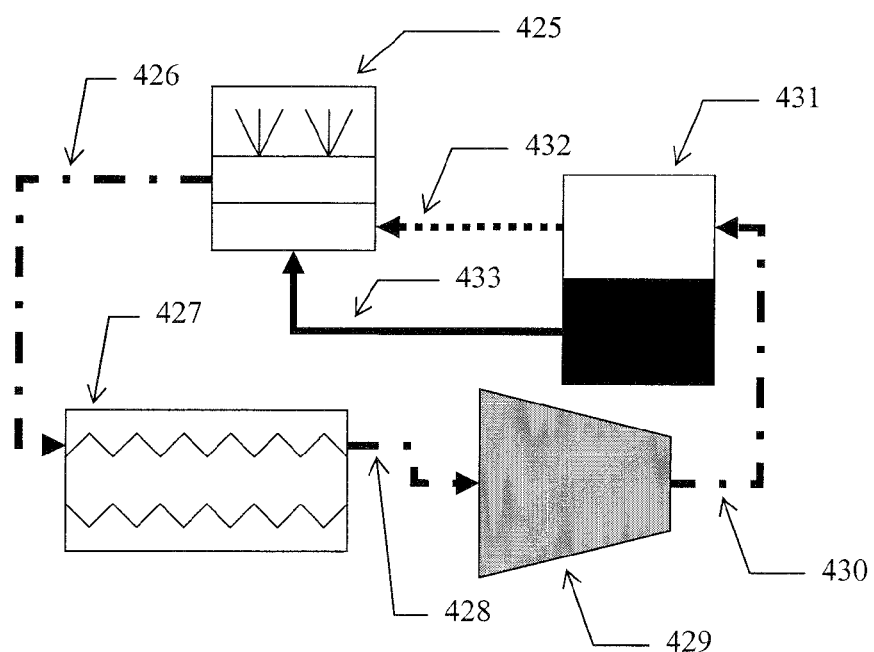
FIG. 18 shows an embodiment in accordance with the subject invention incorporating a phase separator, condenser and two phase pump.

A condenser can condense the evaporated liquid and reject the acquired heat in several different fashions, examples of which are described as follows:

The condenser may accept all of the exhaust flow as two phase and then re-condense the evaporated liquid, leaving two phase to exhaust in the case of a two phase nozzle application, or single phase liquid in the case of a pressure atomizing nozzle. This function of the condenser can be used in embodiments shown in FIGS. 8, 10B (with expansion valve 35 removed), 15, 18, 19, and 28. In FIG. 8, in a specific embodiment, the exhaust of the nozzle 40 will flow as a high quality two phase flow through 43 to the two phase pump 20 and then to the condenser 30 through 25 still as a two phase flow. The exhaust of the condenser through line 24 then will be two phase. If a pressure atomizing nozzle is used then condensing all of the evaporated liquid will provide for single phase liquid exhausting the condenser through line 24. In FIG. 18, in a specific embodiment, exhaust from nozzle 425 enters condenser 427 via line 426 and exits as two phase flow to compressor 429 via line 428. The exhaust of the compressor 429 is still two phase as it enters a phase separator 431 via line 430. Separated vapor and liquid enters the nozzle 425 via lines 432 and 433, respectively.

An expansion valve may be used to allow the condenser to operate at a high pressure. High pressure condensers can reject heat to higher temperature heat sinks which is helpful if a cold heat sink is not available for the application. When placing an expansion valve after the condenser, the condenser may re-condense all of the vapor in the two phase flow, not just the evaporated coolant. Vapor required for a two phase or vapor-assist nozzle will be regained when the flowing coolant expands through the valve, lowering the pressure of the coolant by which some evaporation will produce the proper amount of vapor flow required for the nozzle. The same FIGS. 8, 10B, 15, 18, 19, and 28 can be used to represent the condenser function, providing that the condenser/expansion valve exist as a single unit in the figures (except FIG. 10B where the expansion valve 35 is already diagramed separately). FIG. 30 is used to better show the condenser/expansion valve as a single unit. When a single component condenser is drawn as is 557 it may represent the case where a condenser 560 and an expansion valve 561 are in line. In either case a two phase flow or single phase vapor will enter in 556 or 559 and exit as a two phase flow through 558 and 562. In FIG. 8, for a specific embodiment example, the condenser 30 can condense the two phase flow that entered through line 25 to a single phase liquid at a high pressure. The flow can then be expanded to a lower pressure and exit as a two phase flow to line 24. For this specific embodiment, the nozzle 40 is a two phase nozzle.

The condenser may accept only vapor from the nozzle exhaust and bypass the liquid flow. In this case, a phase separator can be used upstream to send the single phase vapor to the condenser. The vapor flow then would include the evaporated liquid and the original vapor sent to the nozzle, if using a vapor assist nozzle. The condenser therefore only condenses the evaporated liquid, leaving the original vapor flow as is. Therefore, the exit of the condenser will still have two phase flow at the exit. The bypassed liquid will need to be combined with the newly condensed liquid before entering the nozzle. This function of the condenser can be used in cycle examples displayed in FIGS. 9, 10A, 20, and 25. In FIG. 9, for a specific embodiment, the entrance to the condenser 30 flows single phase vapor through 25. The exit of the condenser flows two phase flow through 24.

An expansion valve may be used in this configuration as well. When placing an expansion valve after the condenser, the condenser may re-condense all of the vapor of the inlet flow, not just the portion of the vapor that is the evaporated coolant. Vapor required for a two phase or vapor-assist nozzle will be regained when the flowing coolant expands through the valve, lowering the pressure of the coolant by which some evaporation will produce the proper amount of vapor flow required for the nozzle. This function of the condenser can be used in cycle examples also displayed in FIGS. 9, 10A, 20, and 25, providing that the condenser/expansion valve exist as a single unit in the figures (except FIG. 10A where the expansion valve 35 is already diagramed separately). In FIG. 9, in a specific embodiment, the condenser 30 can condense the single phase vapor flow that entered through line 25 to a single phase liquid at a high pressure. The flow can then be expanded to a lower pressure and exit as a two phase flow to line 24. For this specific embodiment, the nozzle 40 must be a two phase nozzle.

Figure 17:
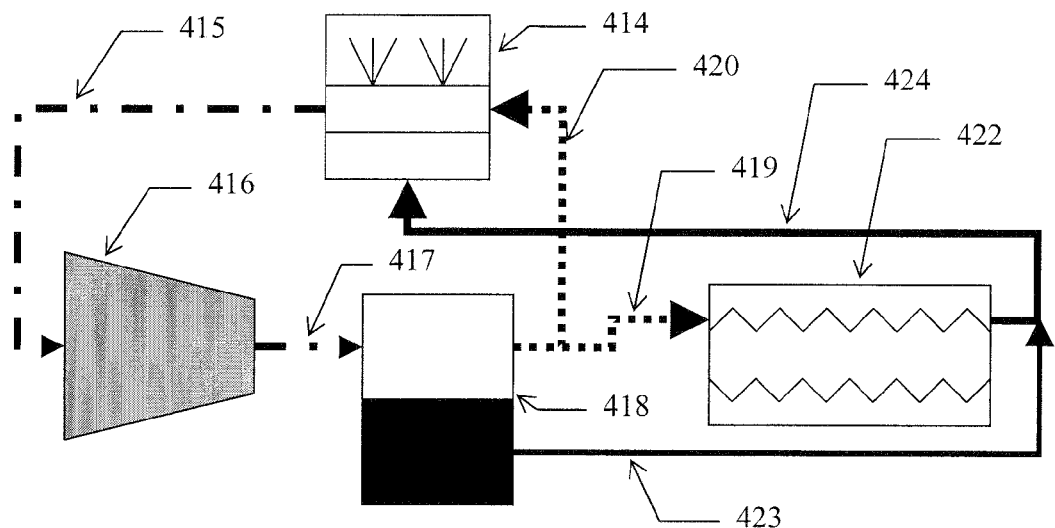
FIG. 17 shows an embodiment in accordance with the subject invention incorporating a condenser, phase separator, and two phase pump.

The condenser can also accept only the vapor from the evaporated liquid, bypassing the other exhaust (liquid and vapor) from the nozzle. A phase separator would be preferred for this type of condenser as well. This condensation process will typically have a lower amount of mass flowing through it compared with condenser configuration described above. This function of the condenser can be used in cycle examples shown in FIGS. 13, 17, 23, 26, and 29. In FIG. 17, for a specific embodiment example, the single phase vapor enters the condenser 422 and exits as a single phase liquid through 424.

Coolant Pumping

Two phase pumps typically move high ratios of liquid to vapor. Higher ratios of liquid to vapor can exist after the condenser and before the nozzle evaporator. It is possible to push vapor through a condenser with a compressor so that liquid exits. It is also possible to suck liquid out of the condenser using a pump. Therefore placing a compressor before the condenser or a pump after would have the same result. Both a compressor and a pump can be placed inline with a condenser between them, where each does half the work.

Heat Rejection Condenser and Pump Arrangements

Two Phase Arrangements

Figure 15:
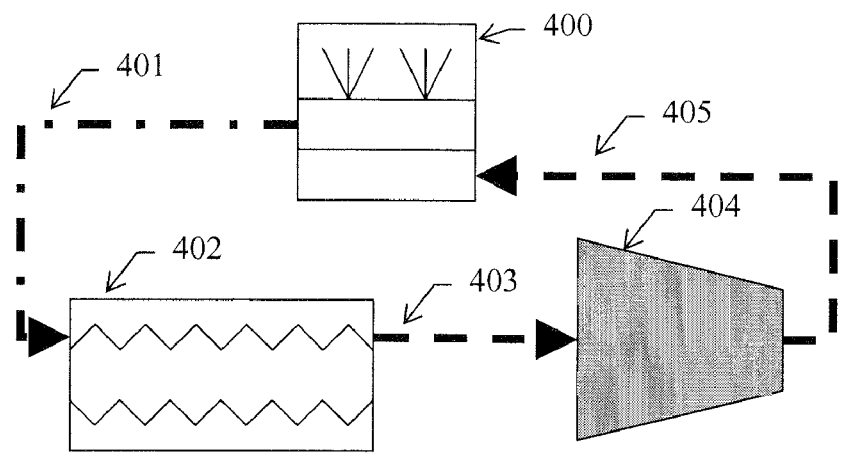
FIG. 15 shows an embodiment in accordance with the subject invention incorporating a condenser and compressor.

If no phase separator is placed after the nozzle evaporator then a two phase pump and two phase condenser can be used. Configuring the order of the components can be decided based on the advantages and disadvantages of pumps and condensers discussed above. Cycles with the condenser placed before the two phase pump are shown in FIGS. 15 and 18. In FIG. 15, for a specific embodiment example, the condenser is placed directly after the nozzle component. With no phase separator in-between, the condenser 402 will receive two phase flow from 401. The two phase pump 404 is placed after the condenser and receives low quality flow which is pressurized and sent to the nozzle array. The cycle may also use a pressure atomizing nozzle as 400. In this case all of the evaporated liquid will be condensed in 402 and exit as a single phase liquid at 403. Therefore a single phase liquid pump 404 would pressurize the coolant and send single phase liquid through 405 to the nozzle. Both cycles of FIGS. 15 and 18 can use the optional expansion valve 561 to increase the condenser pressure. Furthermore, since the cycle of FIG. 18 sends separated vapor and liquid flow to the nozzle, a sub-cooler may be added to the cycle.

Cycles with the two phase pump placed before the condenser are shown in FIGS. 8 and 10B. In FIG. 8, for a specific embodiment example, two phase flow exits the nozzle array through 43 and enters the two phase pump 20 at a high quality. The pressurized flow then enters the condenser 30 through line 25 and exits as a low quality flow through line 24 to re-enter the nozzle array 40. This specific cycle may also use a pressure atomizer nozzle in place of expansion evaporator 10. In this case the condenser 30 would condense all of the evaporated liquid leaving a single phase liquid to exit and flow to the pressure atomizing nozzle. Both cycles of FIGS. 8 and 10B can use the optional expansion valve 561 to increase the condenser pressure. Furthermore, since the cycle of FIG. 10B sends separated vapor and liquid flow to the nozzle, a sub-cooler may be added to the cycle.

Separated Flow Arrangements

Figure 21:
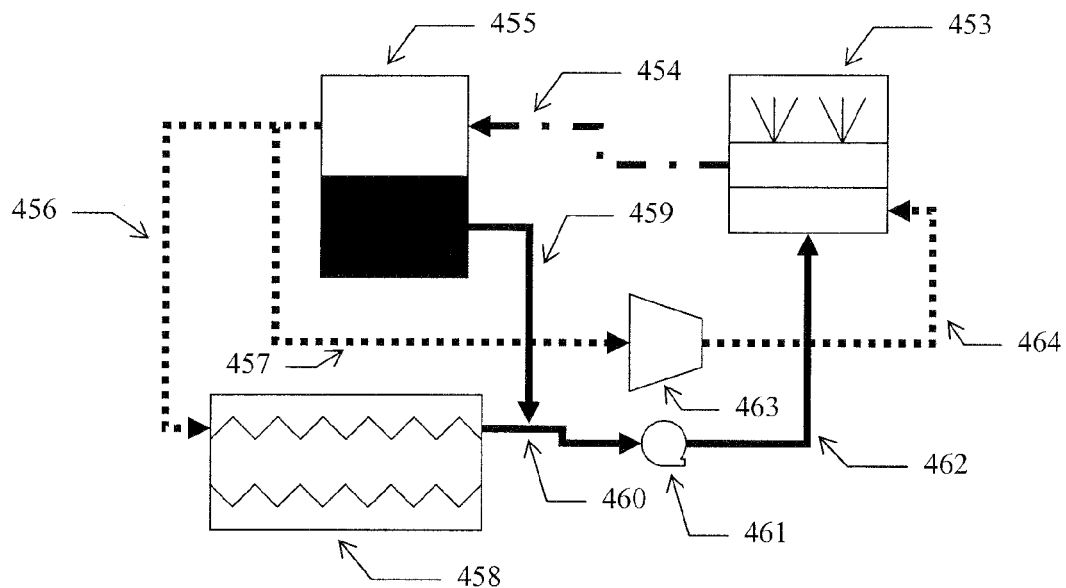
FIG. 21 shows an embodiment in accordance with the subject invention incorporating a liquid pump, vapor compressor, condenser, and phase separator.
Figure 31:
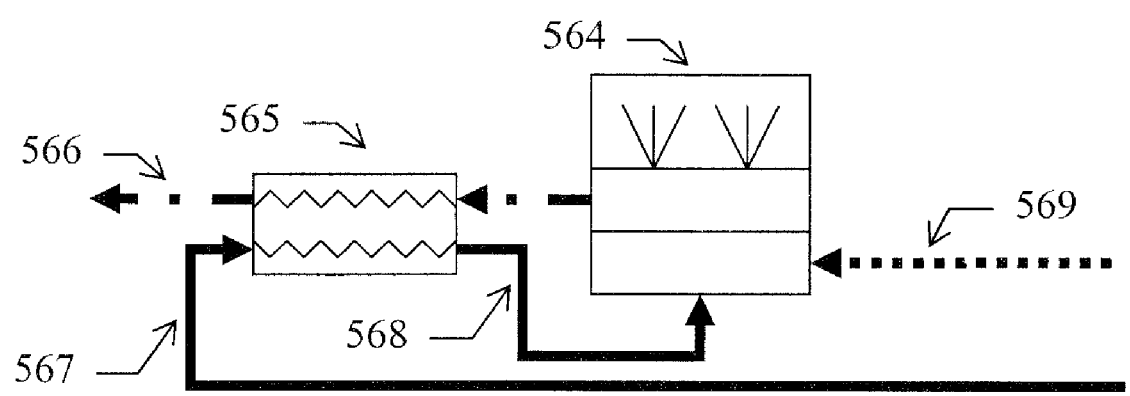
FIG. 31 shows an embodiment to sub-cool liquid in accordance with the subject invention.

If a phase separator is placed after the nozzle array then a separated flow arrangement can be made. In this case a separate vapor compressor and liquid pump can be used to move the coolant. As shown for the two phase arrangements, two variations exist where the placement of the fluid pumping and heat rejection condenser can be switched. Cycle examples where the condenser or thermal energy storage unit is placed before the liquid pump are shown in FIGS. 13 and 21. In FIG. 13, for a specific embodiment example, the exhaust flow 75 of the nozzle enters a phase separator 80 first. Some vapor flow then moves to the TES 42 via line 44 and fully condenses to single phase liquid at line 22 where it can combine with the bypassed liquid 85. The single phase liquid at line 22 and the bypassed liquid 85 can enter an optional phase separator 50 through pumps 41 and 90, respectively, and then can travel to the nozzle array 70. Some vapor flow can enter the compressor 20. Once compressed, the flow can enter an optional phase separator 50 and then travel to the nozzle array 70. FIG. 21 shows the same cycle arrangement with the elimination of the optional phase separator 50. The exhaust flow 454 of the nozzle 453 enters a phase separator 455. Then some vapor flow 456 moves to the condenser 458 and some vapor flow 457 moves to a vapor compressor 463 that sends vapor flow 464 to the nozzle 453. The condenser 458 fully condenses the vapor flow 456 to a single phase liquid flow 460, which then combines with the liquid flow 459 leaving the phase separator 455. The combined liquid flows 459 and 460 enter a liquid pump 461 and then travel to the nozzle 453 via line 462. Because the liquid entrance flow of the nozzle is in an independent line, a heat exchanger may be used to sub-cool the liquid as shown in FIG. 31.

Figure 23:
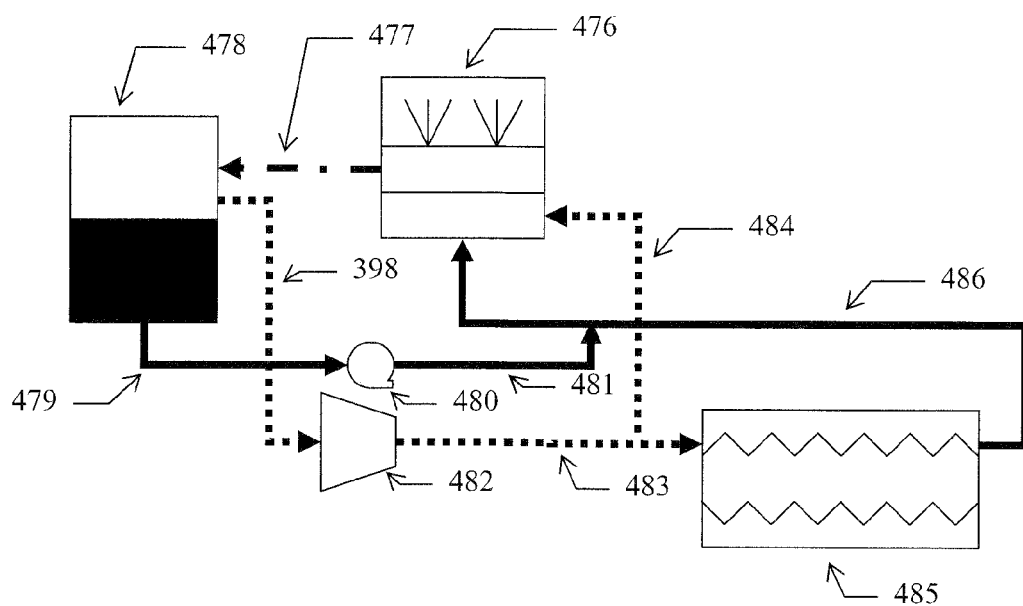
FIG. 23 shows an embodiment in accordance with the subject invention incorporating a condenser, liquid pump, vapor compressor, and phase separator.
Figure 26:
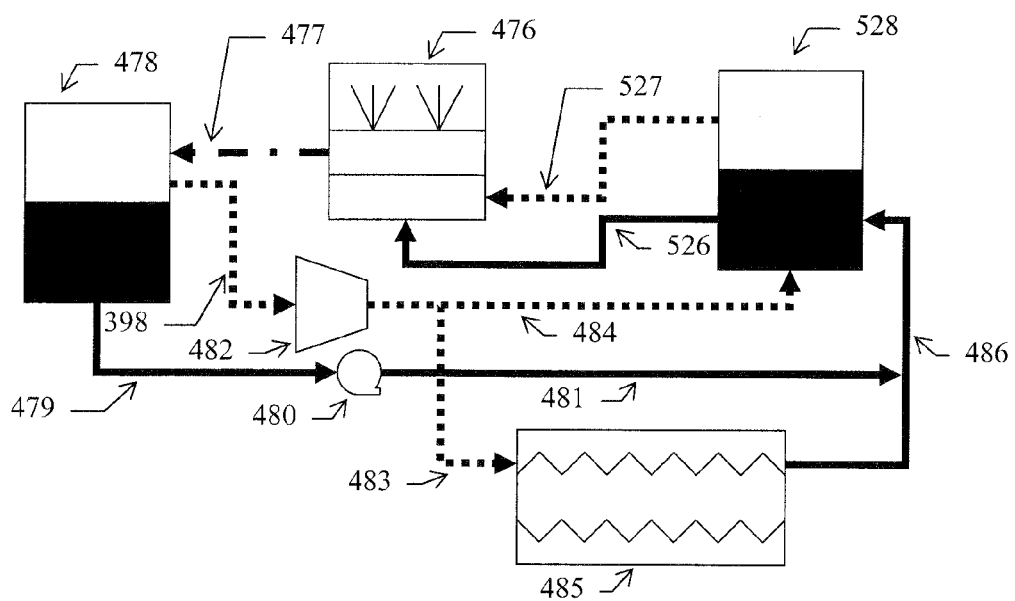
FIG. 26 shows an embodiment in accordance with the subject invention incorporating a phase separator for inputting to a spray nozzle, phase separator accepting exhaust from the spray nozzle, condenser, liquid pump, and vapor compressor.

Cycle examples where the compressor is placed before the condenser are shown in FIGS. 23 and 26. In FIG. 23, for a specific embodiment example, the exhaust flow 477 of the nozzle 476 enters a phase separator 478 first. Separated liquid and vapor flows 479 and 398 enter a pump 480 and compressor 482 respectively. Part of the pressurized vapor flow 483 enters a condenser 485 where it is fully condensed. The two liquid flows 486 and 481 combine and enter nozzle 476, and separate vapor 484 enters the nozzle 476 via line 484. FIG. 26 shows the same cycle arrangement with the addition of a phase separator 528 in liquid line 486 after liquid flow 481 combines with the liquid flow exiting the condenser 485 and vapor line 484 such that liquid flow enters nozzle 476 via line 526 and vapor flow enters nozzle 476 via line 527. Because the liquid entrance flow of the nozzle is in an independent line, a heat exchanger may be used to sub-cool the liquid as shown in FIG. 31.

Figure 20:
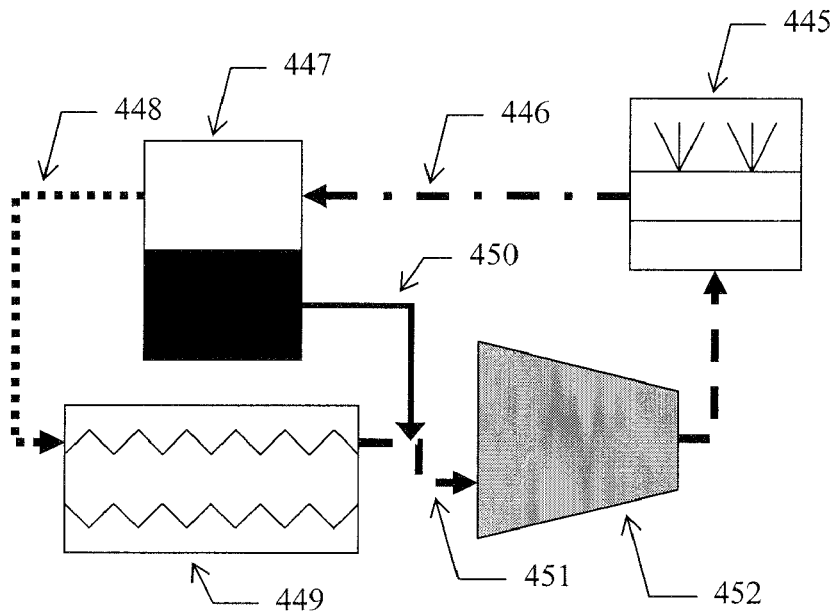
FIG. 20 shows an embodiment in accordance with the subject invention incorporating a two phase pump, condenser, and phase separator.
Figure 25:
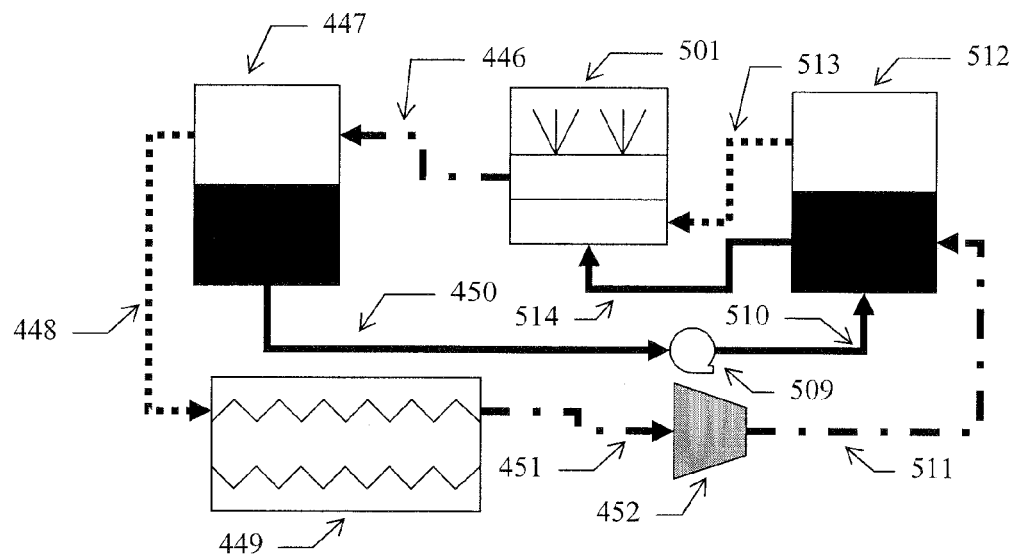
FIG. 25 shows an embodiment in accordance with the subject invention incorporating a phase separator for inputting to a spray nozzle, phase separator accepting exhaust from the spray nozzle, liquid pump, two phase pump, and condenser.

Separated Flow Entrance with "Single Phase Inlet and Two Phase Outlet" Condenser If a phase separator is placed after the nozzle array then the entrance to the condenser and fluid pump will exist as separated components. In this case if the condenser is configured to accept all of the vapor flow then a two phase pump will be required. Cycle examples of this configuration are shown in FIGS. 20 and 25. In FIG. 20, for a specific embodiment example, two phase flow 446 enters the phase separator 447 first. All of the vapor 448 enters the condenser 449 and exits as two phase or as single phase liquid through 451 if a pressure atomizer nozzle is used. The bypassed liquid 450 is then combined with the two phase or single phase liquid flow 451 of the condenser and they enter a two phase pump or single phase liquid pump 452. Pressurized two phase or single phase liquid flow then enters the two phase or pressure atomizing nozzle 445. For a specific embodiment example, as shown in FIG. 25, all of the vapor 488 enters the condenser 449 and exits as two phase liquid through 451. The bypassed liquid 450 does not combine with the two phase flow 451. Instead, the bypassed liquid 450 moves through liquid pump 509 and into a second phase separator 512 via line 510. The two phase flow 451 enters a two phase liquid pump 452 and then enters the second phase separator 512 via line 511. Vapor flow and liquid flow enter nozzle 501 from the second phase separator 512 via lines 513 and 514, respectively. Both cycles of FIGS. 20 and 25 can use the optional expansion valve to increase the condenser pressure. Furthermore, since the cycle of FIG. 25 sends separated vapor and liquid flow to the nozzle, a sub-cooler may be added to the cycle.

Switching the order of the condenser and fluid pump will allow the use of single phase pumps. Cycle examples of this configuration are shown in FIGS. 9 and 10A. In FIG. 9, for a specific embodiment example, all of the vapor that is separated in the phase separator 16 is compressed in compressor 20 and sent through the condenser 30. This flow then exits the condenser 30 as two phase flow through line 24 after all of the evaporated liquid from the nozzle array has been condensed. The liquid flow from the phase separator 16 is sent to a pump 18 via line 17 and is combined with the two phase flow exiting the condenser before it enters the nozzle array. This cycle may also use a pressure atomizing nozzle and flow single phase liquid out of the condenser. Both cycles of FIGS. 9 and 10A can use the optional expansion valve to increase the condenser pressure. Furthermore, since the cycle of FIG. 10A sends separated vapor and liquid flow to the nozzle, a sub-cooler may be added to the cycle.

Figure 22:
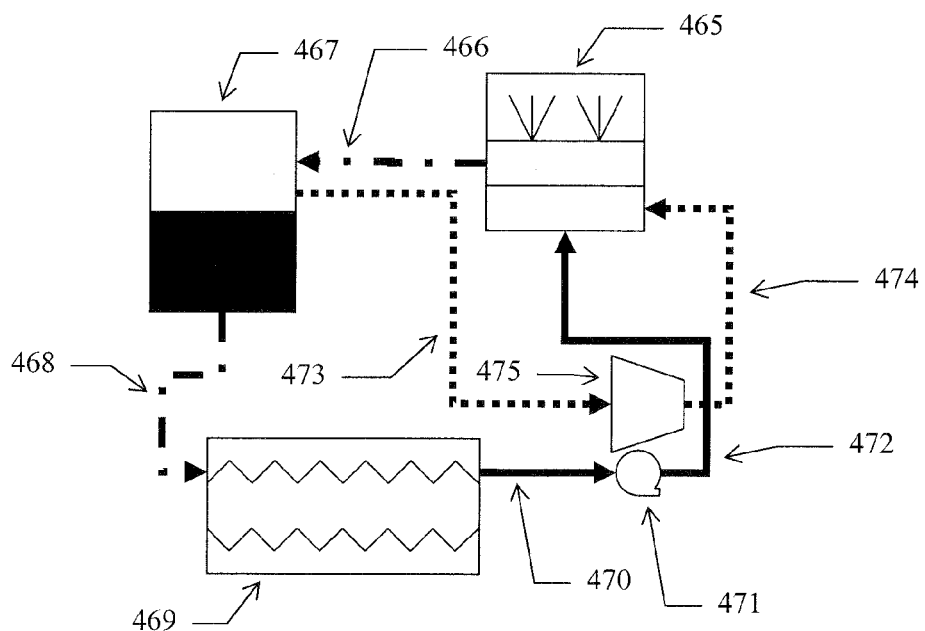
FIG. 22 shows an embodiment in accordance with the subject invention incorporating a liquid pump, vapor compressor, condenser, and phase separator.
Figure 24:
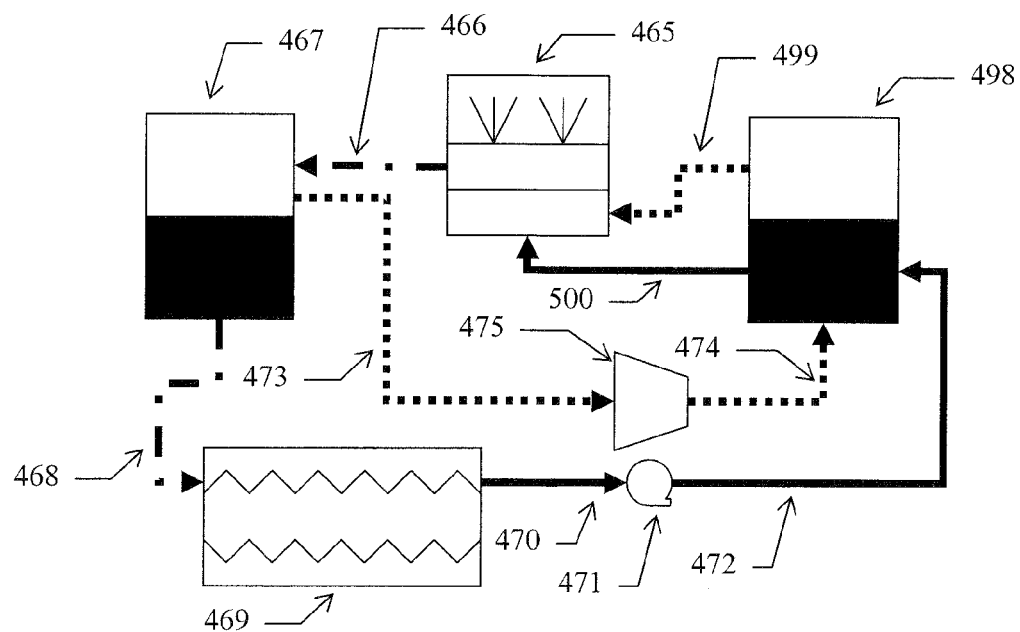
FIG. 24 shows an embodiment in accordance with the subject invention incorporating a phase separator for inputting to a spray nozzle, phase separator accepting exhaust from the spray nozzle, liquid pump, vapor compressor, and condenser.

Separated Flow Entrance with "Two Phase Inlet and Single Phase Outlet" Condenser In an embodiment, the condenser can condense two phase flow to a single phase liquid flow. Cycle examples of this configuration are shown in FIGS. 22 and 24. In FIG. 22, for a specific embodiment example, two phase exhaust 466 enters phase separator 467 first. A two phase flow enters the condenser 469 from the phase separator 467 via line 468. Single phase liquid flow leaves the condenser 469 through line 470 and is sent through pump 471 to the nozzle 465 via line 472. The vapor flow exits phase separator 467 through line 473 and is sent through vapor compressor 475 before it enters the nozzle array 465 via line 474. FIG. 24 shows the same cycle arrangement with the addition of a phase separator 498 in liquid flow line 472 and vapor flow line 474 such that single phase liquid exits phase separator 498 and enters nozzle 465 via line 500 and vapor flow exits phase separator 498 and enters nozzle 465 via line 499.

Phase Separation Between Condensing and Pumping

Figure 19:
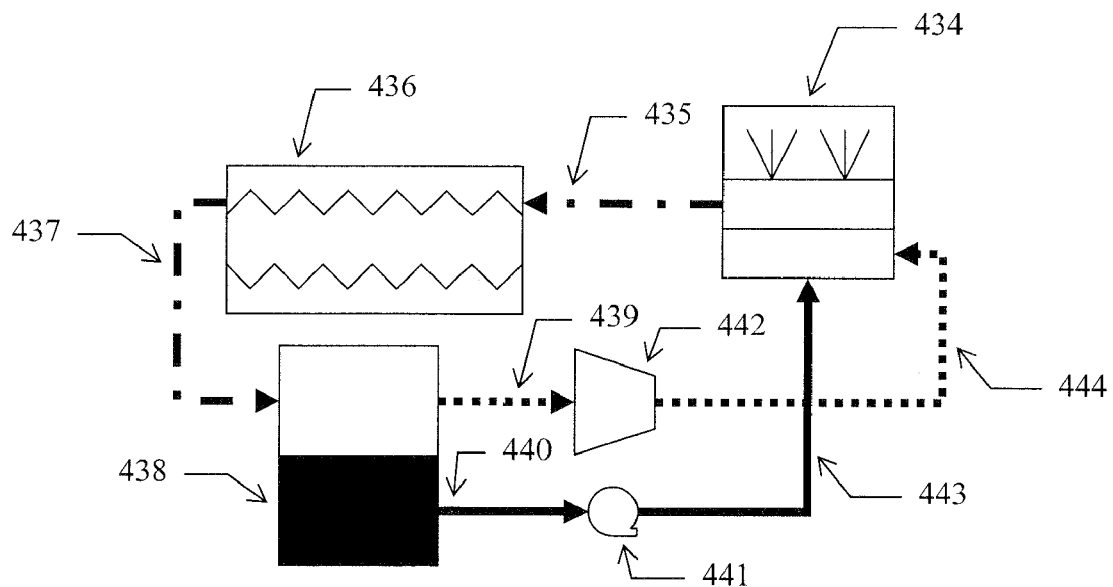
FIG. 19 shows an embodiment in accordance with the subject invention incorporating a liquid pump, vapor compressor, phase separator, and condenser.
Figure 28:
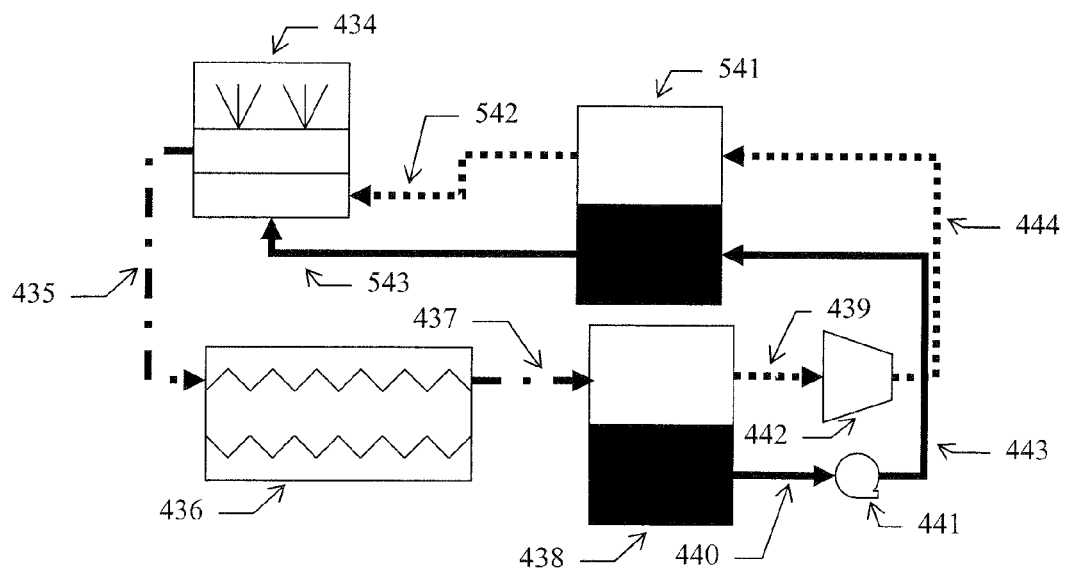
FIG. 28 shows an embodiment in accordance with the subject invention incorporating a phase separator for inputting to a spray nozzle, a condenser, a phase separator accepting two phase flow from the condenser, a liquid pump, and a vapor compressor.

If no phase separator exists after the nozzle component, then the two phase flow can enter either the condenser or a two phase pump. If the condenser is placed first, then the flow will enter two phase of a high quality and exit as a low quality. The two phase flow can then enter a phase separator and then enter a pump and compressor, sent as separated flows to the nozzle component. This cycle arrangement is shown in FIGS. 19 and 28. In FIG. 19, as a specific embodiment example, two phase flow from the nozzle exhaust 435 enters the condenser 436 first. Flow then exits via line 437 at a lower quality and enters a phase separator 438. Vapor flow is sent to a vapor compressor 442 before entering nozzle array 434 via line 444 and liquid flow is sent to a liquid pump 441 before entering nozzle 434 via line 443. The vapor compressor 442 and liquid pump 441 are used to increase the pressure of the vapor flow in line 439 and liquid flow in line 440 before the nozzle array 434. Both cycles of FIGS. 19 and 28 can use the optional expansion valve to increase the condenser pressure. FIG. 28 shows the same cycle arrangement as FIG. 22 with the addition of a second phase separator 541 in liquid flow line 443 and vapor flow line 444 such that vapor flow enters nozzle 434 via line 542 and liquid flow enters nozzle 434 via line 543. Because the liquid entrance flow of the nozzle is in an independent line, a heat exchanger may be used to sub-cool the liquid as shown in FIG. 31.

Figure 16:
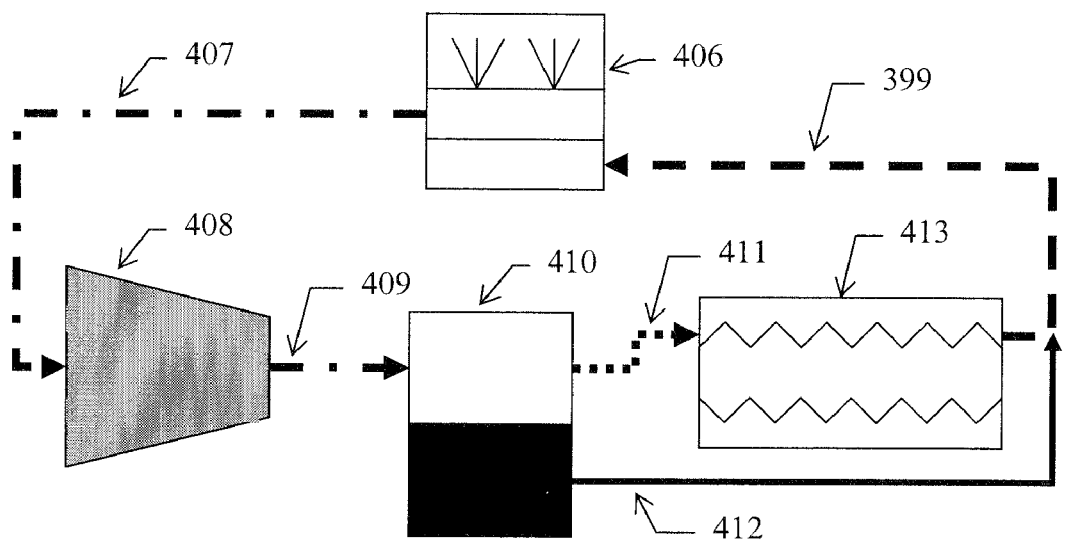
FIG. 16 shows an embodiment in accordance with the subject invention incorporating a condenser, phase separator, and two phase pump.
Figure 27:
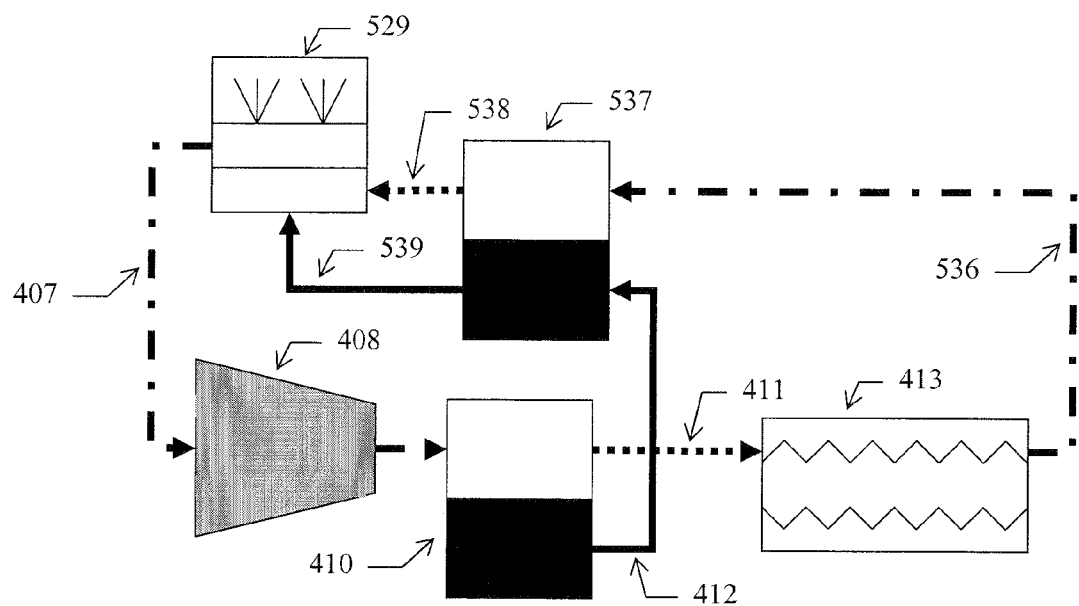
FIG. 27 shows an embodiment in accordance with the subject invention incorporating a phase separator for inputting to a spray nozzle, two phase pump, phase separator accepting two phase flow from the two phase pump, and condenser.

Alternatively, a two phase pump can be used to increase the pressure first, to then send the two phase flow to a phase separator. If a condenser is used that excepts all of the vapor flow and exhausts two phase flow, then bypassed liquid and the two phase outlet of the condenser will have to be combined and sent to either a phase separator or a two phase nozzle. Cycle examples of this arrangement are shown in FIGS. 16 and 27. In FIG. 16, for a specific embodiment example, exhaust flow 407 enters a two phase pump 408 first. The mixed flow 409 is then separated in a phase separator 410. The vapor flow 411 is then sent to a condenser 413 and exits as two phase flow 399. The liquid flow 412 is combined with the two phase flow 399 and then sent to a two phase nozzle 406. This cycle can also be configured for a pressure atomizing nozzle where single phase liquid exits the condenser 413. In FIG. 27, for a specific embodiment example, the vapor flow 411 is sent to condenser 413 and exits as a two phase flow via line 536. The two phase flow 536 enters a second phase separator 537. The liquid flow 412 is sent directly to the second phase separator 537. Then, vapor flow is sent from the phase separator 537 to the nozzle 529 via line 538 and liquid flow is sent to the nozzle 529 via line 539. Both cycles of FIGS. 16 and 27 can use the optional expansion valve to increase the condenser pressure.

Figure 29:
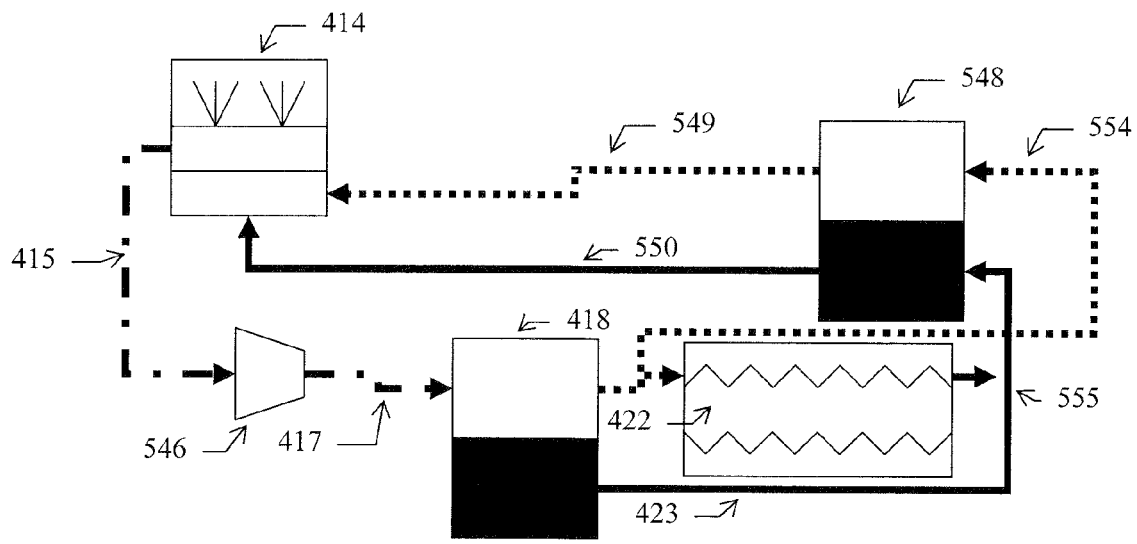
FIG. 29 shows an embodiment in accordance with the subject invention incorporating a phase separator for inputting to a spray nozzle, vapor compressor, phase separator accepting two phase flow from the vapor compressor, and condenser.

If a condenser is configured to have a single phase inlet and outlet then the separated liquid and vapor flow is available to send to a vapor assist nozzle. Cycle examples of this configuration are shown in FIGS. 17 and 29. In FIG. 17, for a specific embodiment example, the exhaust 415 of the nozzle 414 enters a two phase pump 416 and then enters a phase separator 418 via line 417. Part of the vapor is sent to the condenser 422 via line 419 where it is fully condensed. This liquid is combined with the liquid 423 of the phase separator 418. Separated liquid via line 424 and vapor via line 420 is then sent to a vapor assist nozzle 414. In FIG. 29, for a specific embodiment example, two phase exhaust from nozzle 44 enters a vapor compressor 546 via line 415. Two phase flow exits vapor compressor 546 and enters the phase separator 418 via line 417. Part of the vapor is sent to condenser 422 where it is fully condensed. This liquid combines with the liquid 423 of the phase separator 418 and enters a second phase separator 548 via line 555. The other part of the vapor from phase separator 418 is sent to the second phase separator 548 via line 554. Vapor and liquid is sent to nozzle 414 from the second phase separator 548 via lines 549 and 550, respectively. Both cycles of FIGS. 17 and 29 can use the optional expansion valve to increase the condenser pressure. Because the liquid entrance flow of the nozzle is in an independent line, a heat exchanger may be used to sub-cool the liquid as shown in FIG. 31.

All patents, patent applications, provisional applications, and publications referred to or cited herein are incorporated by reference in their entirety, including all figures and tables, to the extent they are not inconsistent with the explicit teachings of this specification Sample and embodiments described herein are for illustrative purposes only and that various modifications or changes in light thereof will be suggested to persons skilled in the art and are to be included within the spirit and purview of this application and the scope of the appended claims.

We claim:

1. A method of removing heat from a heat source, comprising:
    locating a piece of material having a plurality of subsections, wherein each subsection shares a partition wall with at least one adjacent subsection in contact with a surface of a heat source; and
    spraying a liquid coolant through each subsection onto the surface of the heat source, wherein the liquid coolant sprayed onto the surface of the heat source absorbs heat from the surface of the heat source, and carries the absorbed heat away as the coolant leaves the surface of the heat source, wherein the partition wall shared by a subsection with an adjacent subsection reduces the flow of coolant from the subsection to the adjacent subjection and the flow of coolant from the adjacent subsection to the subsection.

2. The method according to claim 1, further comprising;
    creating a seal between the partition walls and the surface of the heat source.

3. The method according to claim 1, wherein the heat source is a power electronic device.

4. The method according to claim 1, wherein spraying a liquid coolant onto the surface of the heat source comprises spraying an atomized liquid coolant onto the surface of the heat source.

5. The method according to claim 4, wherein spraying an atomized liquid coolant onto the surface of the heat source comprises spraying droplets having mean diameters in a range from about 10 microns to about 200 microns and velocities in a range from about 5 meters per second to about 50 meters per second.

6. The method according to claim 4, wherein spraying an atomized liquid coolant onto the surface of the heat source comprises spraying droplets having a size and velocity such that the effects of gravity are negligible.

7. The method according to claim 4, wherein spraying an atomized liquid coolant onto the surface of the heat source comprises spraying an atomized liquid spray onto the surface of the heat source with a pressure atomizer nozzle, wherein pressurized liquid is inputted to the pressure atomizer nozzle.

8. The method according to claim 4, wherein spraying an atomized liquid coolant onto the surface of the heat source comprises spraying an atomized liquid coolant onto the surface of the heat source with a vapor assist nozzle, wherein pressurized liquid coolant and pressurized vapor coolant is inputted to the vapor assist nozzle.

9. The method according to claim 4, wherein spraying an atomized liquid coolant onto the surface of the heat source comprises spraying an atomized liquid coolant onto the surface of the heat source with a pressurized vapor nozzle, wherein liquid coolant and vapor coolant is inputted to the pressurized vapor nozzle.

10. The method according to claim 4, wherein spraying an atomized liquid coolant onto the surface of the heat source comprises spraying an atomized liquid coolant onto the surface of the heat source with a vapor atomizing nozzle, wherein flow of vapor through the vapor atomizing nozzle creates a venturi draft on a liquid coolant source inputted to the vapor atomizing nozzle.

11. The method according to claim 4, wherein spraying an atomized liquid coolant onto the surface of the heat source forms a thin film of coolant on the surface of the heat source.

12. The method according to claim 4, wherein the coolant is sprayed such that when the atomized liquid coolant is sprayed onto the surface of the heat source the coolant can begin to boil.

13. The method according to claim 12, wherein a portion of the coolant which is sprayed onto the surface of the heat source evaporates and a remaining portion of the coolant which is sprayed onto the surface of the heat source exits the surface of the heat source out of the subsection due to the momentum of the coolant.

14. The method according to claim 4, wherein upon spraying an atomized liquid coolant onto the surface of the heat source, single phase convection, boiling, and/or free surface evaporation of the coolant occur.

15. The method according to claim 14, wherein coolant sprayed onto the surface of the heat source which boils and/or evaporates is released into the environment.

16. The method according to claim 4, wherein the surface of the heat source is located within a sealed housing and wherein spraying an atomized liquid coolant onto the surface of the heat source is within the sealed housing, wherein the method further comprises: releasing the heat absorbed by the coolant from the surface of the heat source via a condenser.

17. The method according to claim 16, wherein the condenser comprises a heat exchanger.

18. The method according to claim 16, wherein the condenser operates via a subcooled mist of the coolant, wherein the sub-cooled mist of the coolant is sub-cooled below the saturation temperature of the coolant within the sealed housing via a heat exchanger, wherein the heat exchanger is outside the sealed housing, wherein the subcooled mist is sprayed within the sealed housing so as to contact saturated vapor of the coolant evaporating from the surface of the heat source, wherein heat is transferred from the saturated vapor to the sub-cooled mist such that the saturated vapor condenses on the sub-cooled mist and flows to a reservoir of the coolant.

19. The method according to claim 1, wherein the partition wall shared by a subsection with an adjacent subsection substantially eliminates the flow of coolant from the subsection to the adjacent subsection and the flow of coolant from the adjacent subsection to the subsection.

20. The method according to claim 1, wherein the plurality of subsections each share a partition wall with each adjacent subsection.

21. The method according to claim 20, wherein the partition walls are interconnected so as to enclose a portion of the plurality of subsections with the interconnected partition walls.

22. The method according to claim 21, wherein the interconnected partition walls form a pattern such that the portion of the plurality of subsections are enclosed by polygonal shaped sections of the interconnected partition walls.

23. The method according to claim 22, wherein the portion of the plurality of subsections are enclosed by rectangular shaped sections of the interconnected partition walls.

24. The method according to claim 23, wherein the portion of the plurality of subsections are enclosed by square shaped sections of the interconnected partition walls.

25. The method according to claim 22, wherein the portion of the plurality of subsections are enclosed by hexagonal shaped sections of the interconnected partition walls.

26. The method according to claim 1, wherein spraying an atomized liquid coolant onto the surface of the heat source comprises spraying an atomized liquid coolant onto the surface of the heat source via a single spray nozzle such that the single spray nozzle sprays the atomized liquid coolant through each subsection onto the surface of the heat source.

27. The method according to claim 1 wherein spraying an atomized liquid coolant onto the surface of the heat source comprises spraying an atomized liquid coolant onto the surface of the heat source via a plurality of spray nozzles such that the plurality of spray nozzles sprays the atomized liquid coolant through each subsection onto the surface of the heat source.

28. The method according to claim 27, wherein each of the plurality of spray nozzles sprays the atomized liquid coolant through a corresponding subsection onto the surface of the heat source.

29. The method according to claim 1, wherein each subsection has a cross-sectional area of about 2 $cm^2$ or less.

30. The method according to claim 29, wherein each subsection has a cross-sectional area between about 0.5 $cm^2$ and about 2 $cm^2$.

31. The method according to claim 1, wherein the partition walls protrude at least about 0.2 cm from the surface of the heat source.

32. The method according to claim 31, wherein the partition walls protrude between about 0.2 cm and about 2 cm from the surface of the heat source.

33. An apparatus for removing heat from a heat source, comprising:
an interface plate, the interface plate comprising a plurality of subsections wherein each subsection shares a partition wall with at least one adjacent subsection, wherein the interface plate is in contact with a surface of the heat source, a spray nozzle which directs a spray pattern of the liquid coolant through each subsection onto the surface of the heat source, wherein the liquid coolant sprayed onto the surface of the heat source absorbs heat from the surface of the heat source and carries the absorbed heat away as the coolant leaves the surface of the heat source, wherein the partition wall shared by a subsection with an adjacent subsection reduces the flow of coolant from the subsection to the adjacent subsection and the flow of coolant from the adjacent subsection to the subsection.

34. The apparatus according to claim 33, wherein the spray nozzle atomizes the liquid coolant which is sprayed onto the surface of the heat source.

35. The apparatus according to claim 34, wherein the atomized liquid coolant sprayed onto the surface of the heat source comprises droplets having mean diameters in a range from about 10 microns to about 200 microns and velocities in a range from about 5 meters per second to about 50 meters per second.

36. The apparatus according to claim 34, wherein the atomized liquid coolant sprayed onto the surface of the heat source comprises spraying droplets having a size and velocity such that the effects of gravity are negligible.

37. The apparatus according to claim 34, wherein the spray nozzle comprises a pressure atomizer nozzle, wherein pressurized liquid is inputted to the pressure atomizer nozzle.

38. The apparatus according to claim 34, wherein the spray nozzle comprises a vapor assist nozzle, wherein pressurized liquid coolant and pressurized vapor coolant is inputted to the vapor assist nozzle.

39. The apparatus according to claim 34, wherein the spray nozzle comprises a pressurized vapor nozzle, wherein liquid coolant and vapor coolant is inputted to the pressurized vapor nozzle.

40. The apparatus according to claim 34, wherein the spray nozzle comprises a vapor atomizing nozzle, wherein flow of vapor through the vapor atomizing nozzle creates a venturi draft on a liquid coolant source inputted to the vapor atomizing nozzle.

41. The apparatus according to claim 34, wherein the atomized liquid coolant sprayed onto the surface of the heat source forms a thin film of coolant on the surface of the heat source.

42. The apparatus according to claim 34, wherein the coolant is sprayed such that when the atomized liquid coolant is sprayed onto the surface of the heat source the coolant can begin to boil.

43. The apparatus according to claim 42, wherein a portion of the coolant which is sprayed onto the surface of the heat source evaporates and a remaining portion of the coolant which is sprayed onto the surface of the heat source exits the surface of the heat source out of the subsection due to the momentum of the coolant.

44. The apparatus according to claim 34, wherein the atomized liquid coolant sprayed onto the surface of the heat source experiences single phase convection, boiling, and/or free surface evaporation of the coolant.

45. The apparatus according to claim 44, wherein coolant sprayed onto the surface of the heat source which boils and/or evaporates is released into the environment.

46. The apparatus according to claim 34, further comprising a sealed housing and a condenser, wherein the surface of the heat source is located within the sealed housing and wherein the atomized liquid coolant is sprayed onto the surface of the heat source within the sealed housing, wherein: the heat absorbed by the coolant from the surface of the heat source is released via the condenser.

47. The apparatus according to claim 46, wherein the condenser comprises a heat exchanger.

48. The apparatus according to claim 46, further comprising a heat exchanger, and a reservoir of coolant wherein the condenser operates via a sub-cooled mist of the coolant, wherein the sub-cooled mist of the coolant is sub-cooled below the saturation temperature of the coolant within the sealed housing via the heat exchanger, wherein the heat exchanger is outside the sealed housing, wherein the sub-cooled mist is sprayed within the sealed housing so as to contact saturated vapor of the coolant evaporating from the first surface, wherein heat is transferred from the saturated vapor to the sub-cooled mist such that the saturated vapor condenses on the sub-cooled mist and flows to the reservoir of the coolant.

49. The apparatus according to claim 33, wherein the partition wall shared by a subsection with an adjacent subsection substantially eliminates the flow of coolant from the subsection to the adjacent subsection and the flow of coolant from the adjacent subsection to the subsection.

50. The apparatus according to claim 33, further comprising a seal between the partition wall and the surface of the heat source.

51. The apparatus according to claim 33, wherein the heat source is a power electronics device.

52. The apparatus according to claim 33, wherein the plurality of subsections each share a partition wall with each adjacent subsection.

53. The apparatus according to claim 52, wherein the partition walls are interconnected so as to enclose a portion of the plurality of subsections with the interconnected partition walls.

54. The apparatus according to claim 53, wherein the interconnected partition walls form a pattern such that the portion of the plurality of subsections are enclosed by polygonal shaped sections of the interconnected partition walls.

55. The apparatus according to claim 54, wherein the portion of the plurality of subsections are enclosed by rectangular shaped sections of the interconnected partition walls.

56. The apparatus according to claim 55, wherein the portion of the plurality of subsections are enclosed by square shaped sections of the interconnected partition walls.

57. The apparatus according to claim 54, wherein the portion of the plurality of subsections are enclosed by hexagonal shaped sections of the interconnected partition walls.

58. The apparatus according to claim 33, wherein the spray nozzle comprises a single spray nozzle such that the single spray nozzle sprays the atomized liquid coolant through each subsection onto the surface of the heat source.

59. The apparatus according to claim 33, wherein the spray nozzle comprises a plurality of spray nozzles such that the plurality of spray nozzles sprays the atomized liquid coolant through each subsection onto the surface of the heat source.

60. The apparatus according to claim 59, wherein each of the plurality of spray nozzles sprays the atomized liquid coolant through a corresponding subsection onto the surface of the heat source.

61. The apparatus according to claim 33, wherein each subsection has a cross-sectional area of about 2 $cm^2$ or less.

62. The apparatus according to claim 61, wherein each subsection has a cross-sectional area between about 0.5 $cm^2$ and about 2 $cm^2$.

63. The apparatus according to claim 33, wherein the partition walls protrude at least about 0.2 cm from the surface of the heat source.

64. The apparatus according to claim 63, wherein the partition walls protrude between about 0.2 cm and about 2 cm from the surface of the heat source.

* * * * *

UNITED STATES PATENT AND TRADEMARK OFFICE
CERTIFICATE OF CORRECTION

| | | |
|---|---|---|
| PATENT NO. | : 7,921,664 B2 | Page 1 of 1 |
| APPLICATION NO. | : 12/046015 | |
| DATED | : April 12, 2011 | |
| INVENTOR(S) | : Daniel P. Rini et al. | |

It is certified that error appears in the above-identified patent and that said Letters Patent is hereby corrected as shown below:

Column 16,
Lines 12-13, "In a farther specific embodiment" should read --In a further specific embodiment--.

Signed and Sealed this
Twelfth Day of July, 2011

David J. Kappos
*Director of the United States Patent and Trademark Office*